(12) United States Patent
Aaronovitch et al.

(10) Patent No.: US 11,346,865 B2
(45) Date of Patent: May 31, 2022

(54) MULTI-USE TEST LEAD

(71) Applicant: Megger Instruments Ltd., Dover (GB)

(72) Inventors: Sidney Aaronovitch, Dover (GB); Stanislaw Zurek, Dover (GB)

(73) Assignee: MEGGER INSTRUMENTS LTD., Dover (GB)

(*) Notice: Subject to any disclaimer, the term of this patent is extended or adjusted under 35 U.S.C. 154(b) by 294 days.

(21) Appl. No.: 16/680,144

(22) Filed: Nov. 11, 2019

(65) Prior Publication Data

US 2020/0150151 A1    May 14, 2020

(30) Foreign Application Priority Data

Nov. 14, 2018  (GB) ..................... 1818581

(51) Int. Cl.

| | | |
|---|---|---|
| *G01R 15/18* | (2006.01) | |
| *G01R 1/06* | (2006.01) | |
| *G01R 15/12* | (2006.01) | |
| *G01R 1/067* | (2006.01) | |
| G01R 31/50 | (2020.01) | |
| G01R 31/58 | (2020.01) | |

(52) U.S. Cl.
CPC .............. *G01R 15/181* (2013.01); *G01R 1/06* (2013.01); *G01R 1/06788* (2013.01); *G01R 15/12* (2013.01); *G01R 15/18* (2013.01); *G01R 15/183* (2013.01); *G01R 31/50* (2020.01); *G01R 31/58* (2020.01)

(58) Field of Classification Search
CPC .. G01R 15/181; G01R 19/0092; G01R 15/18; G01R 15/183; G01R 15/186; G01R 19/00; G01R 15/185; G01R 21/00; G01R 1/06; G01R 15/12; G01R 1/06788; G01R 31/50; G01R 31/58
USPC ..... 324/72, 76.11–76.83, 115, 126, 149, 127
See application file for complete search history.

(56) References Cited

U.S. PATENT DOCUMENTS

| | | | |
|---|---|---|---|
| 4,522,061 | A | 6/1985 | Hochreuther et al. |
| 7,847,543 | B2 | 12/2010 | Grno |
| 8,330,449 | B2 | 12/2012 | Greenberg |

(Continued)

FOREIGN PATENT DOCUMENTS

| | | |
|---|---|---|
| EP | 2990808 A2 | 6/2015 |
| GB | 1078459 A | 8/1967 |

(Continued)

OTHER PUBLICATIONS

Combined Search and Examination Report dated Mar. 29, 2019 for GB Application No. GB 1818581.9.

*Primary Examiner* — Raul J Rios Russo
(74) *Attorney, Agent, or Firm* — EIP US LLP

(57) ABSTRACT

A test lead for an electrical meter is provided. The test lead comprises a flexible elongate member comprising a current sensing coil at least partially disposed about a flexible core along the length of the member. A first connector is disposed at one end of the member for coupling a respective end of the current sensing coil to a test port of an electrical meter. A second connector is disposed at an opposing end of the member for coupling a respective end of the current sensing coil to an electrically conductive member, to provide an electrical path, via the sensing coil, from the electrically conductive member to the first connector.

20 Claims, 18 Drawing Sheets

(56) References Cited

U.S. PATENT DOCUMENTS

| | | | |
|---|---|---|---|
| 2002/0180417 A1* | 12/2002 | Colby | G01R 15/18 |
| | | | 324/117 R |
| 2004/0243325 A1* | 12/2004 | Tate | G01R 22/065 |
| | | | 702/64 |
| 2010/0259347 A1* | 10/2010 | Ziegler | H01H 83/04 |
| | | | 335/14 |
| 2011/0012587 A1 | 1/2011 | Greenberg | |
| 2013/0257412 A1 | 10/2013 | Wynne | |
| 2014/0167740 A1 | 6/2014 | Gilbert | |
| 2015/0002138 A1 | 1/2015 | Fox | |
| 2016/0055963 A1 | 2/2016 | Lockstedt | |
| 2017/0059621 A1 | 3/2017 | Cook | |
| 2018/0358687 A1* | 12/2018 | Cho | H01Q 1/243 |

FOREIGN PATENT DOCUMENTS

| | | |
|---|---|---|
| GB | 2562278 A | 11/2018 |
| JP | 2017191018 A | 10/2017 |

\* cited by examiner

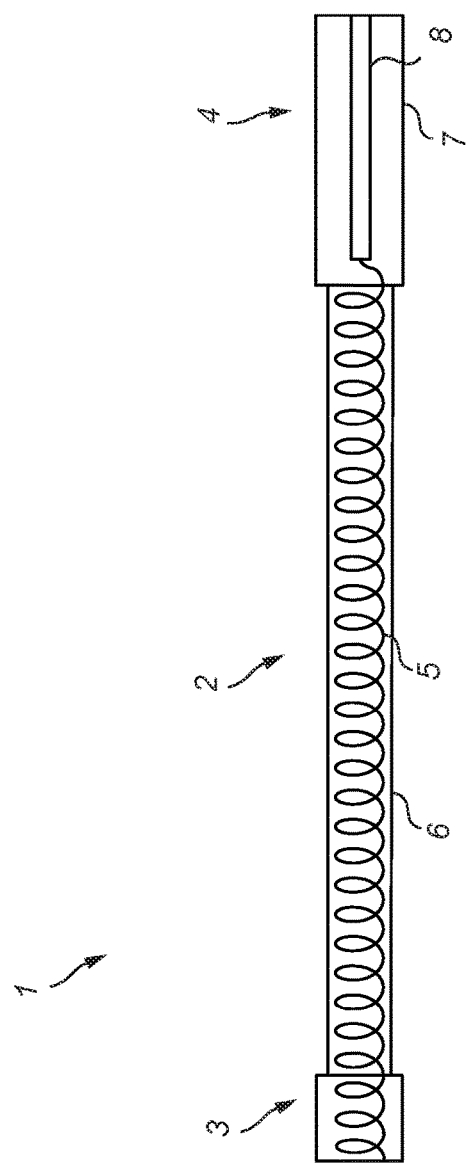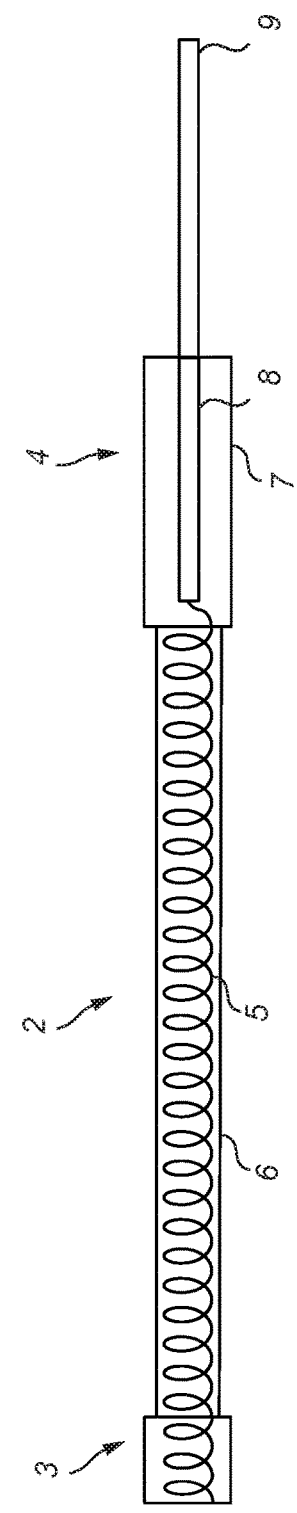
FIG. 1a
FIG. 1b

MULTI-USE TEST LEAD

CROSS-REFERENCE TO RELATED APPLICATIONS

This application claims priority to UK Application No. GB1818581.9, filed Nov. 14, 2019, under 35 U.S.C. § 119(a). The above-referenced patent application is incorporated by reference in its entirety.

TECHNICAL FIELD

The present application generally relates to a multi-use test lead. More specifically but not exclusively, the present application relates to a test lead comprising a flexible elongate member for use in sensing current and measuring voltage.

BACKGROUND

Electrical meters may be used to connect temporarily to electrical circuits to provide measurements or other information about the operation of the circuit. Such test equipment may require direct electrical contact with an electrically conductive part of the circuit. This may be done using a test lead with an electrical connection apparatus for electrically connecting the circuit to the meter. In other cases, electrical meters may measure an electromagnetic field emanating from the electrical circuit without directly contacting a conductive part of the circuit.

It is desirable to test a circuit or multiple different circuits in close proximity to each other using different measurement techniques for example, directly connecting to a conductive part of the circuit to measure voltage or measuring an electromagnetic field emanating from the circuit to sense current passing through a conductor. However, different measurement techniques utilise different types of test leads or test apparatus. When it is necessary to test a variety of circuits or take a variety of measurements of one circuit it is inefficient to have to change between the test apparatus being used.

It is an object of the present application to address at least some of the limitations of the prior art apparatus.

SUMMARY

According to a first aspect of the present disclosure, there is provided a test lead for an electrical meter, the test lead comprising a flexible elongate member comprising a current-sensing coil at least partially disposed about a flexible core along the length of the member, a first connector disposed at one end of the member for coupling a respective end of the current-sensing coil to a test port of an electrical meter, and a second connector disposed at an opposing end of the member for coupling a respective end of the current-sensing coil to an electrically conductive member, to provide an electrical path, via the current-sensing coil, from the electrically conductive member to the first connector.

This allows the test lead to be used to electrically probe a conductive part of a circuit to measure electrical properties such as current and voltage, either by connecting the first connector to an electrical meter configured to measure the electrical properties and by physically connecting either the second connector of the test lead to a conductive test point in an electrical circuit or connecting the second connector to an electrically conductive member which may then be connected to the test point in the electrical circuit. By having a current-sensing coil in the lead it may also be possible to sense current in current-carrying conductors without electrically connecting to the current-carrying conductor to be tested.

In some examples, the flexible elongate member comprises the current-sensing coil and a return conductor disposed along the length of the flexible elongate member.

This allows the test lead to measure electrical properties of circuits by probing conductive test points and also to be used similarly to a Rogowski coil to sense current.

In some examples, the current-sensing coil is a helically coiled conductor wound around the return conductor. In some examples, the return conductor is positioned externally to the current-sensing coil.

In some examples, the current-sensing coil and the return conductor are isolated from one another in the test lead. This allows the current-sensing coil and the return conductor to be used separately as a current-carrying and a voltage-sensing conductor respectively, or vice versa, for use in four-wire sensing measurements.

In some examples, the second connector comprises an insulating part. This allows the second connector to be safely and accurately operated by a user to electrically engage with conductive test points.

In some examples, at least part of the current-sensing coil is disposed within the insulating part. This allows the flexible elongate member to have a smaller gap between the ends of the current-sensing coil when positioned around a current-carrying conductor. Controlling the opening between the ends of the current-sensing coil when sensing current allows greater accuracy in the determination of current.

In some examples, the second connector comprises a mechanical attachment part for coupling the respective end of the test lead to a second test lead. This allows two test leads to be held in position during a current-sensing measurement.

In some examples, the second connector comprises an electrical and mechanical attachment part for coupling the respective end of the current-sensing coil to the second test lead, to provide an electrical path, via the current-sensing coil, from the first connector to a further current-sensing coil of the second test lead. This allows an electrical and mechanical connection between the current-sensing coils of two such test leads, thereby allowing two such test leads to be connected when sensing current in a current-carrying conductor in examples where the test leads do not comprise return conductors.

In some examples, the second connector comprises a receiving portion for receiving a further electrically conductive member. This may allow the second connector to attach to a further second connector by receiving an electrically conductive member connected to said further second connector.

In some examples, the electrically conductive member is a banana plug.

In some examples, the electrically conductive member is a crocodile clip.

In some examples, the second connector comprises an electrically conductive tip for electrical connection to a test point. An electrically conductive tip may allow the second connector to be used to probe test points in electrical circuits under test.

In some examples, the electrically conductive tip comprises a pointed end.

In some examples, the second connector is for coupling the respective end of the current-sensing coil to an electrically conductive member, to provide a first electrical path, via the current sensing coil, from the electrically conductive member to the first connector, and for coupling a respective end of the return conductor to a second electrically conductive member, to provide a second electrical path, via the return conductor, from the second electrically conductive member to the first connector. This allows the test-lead to be used as a Kelvin type probe having two separate electrical paths provided by the return conductor and the current-sensing coil and connectable to test points via the second connector.

In some examples the flexible core is at least partially magnetic, the flexible core comprising at least one magnetic element, wherein the at least one magnetic element is configured to provide one or more regions of overlap such that a respective gap is provided in each region of overlap, each respective gap being configured such that the effective magnetic permeability of the at least partially magnetic core is maintained during flexing.

This allows the flexible core, and thereby the flexible elongate member, to have an effective magnetic permeability that is controllable at the design stage of the test lead, by the design of the position and overlap of the at least one magnetic element, and that is maintained during flexing of the flexible elongate member. The effective permeability of the present flexible elongate member may therefore have greater controllability and predictability than examples without at least partially magnetic cores, while maintain the flexibility of the test lead to be used to sense current and probe conductive test points.

In some examples, the flexible core is at least partially magnetic, the flexible core comprising at least one flexible at least partially magnetic element.

In some examples, the flexible core is at least partially magnetic, the flexible core comprising a plurality of magnetic elements configured to provide respective gaps between each magnetic element.

In some examples, each respective gap is configured such that the effective magnetic permeability of the at least partially magnetic core is maintained during flexing.

According to a second aspect of the present disclosure there is provided an electrical meter comprising at least a first test lead according to the first aspect of the present disclosure. This may allow the test lead to be directly used for both current sensing of current-carrying conductors and taking electrical measurements by probing electrical conductors.

Further features and advantages of the invention will become apparent from the following description of preferred embodiments of the invention, given by way of example only, which is made with reference to the accompanying drawings.

BRIEF DESCRIPTION OF THE DRAWINGS

Various features of the present disclosure will be apparent from the detailed description which follows, taken in conjunction with the accompanying drawings, which together illustrate features of the present disclosure, and wherein:

FIG. 1a is a schematic diagram of a test lead according to examples;

FIG. 1b is a schematic diagram of the test lead of FIG. 1a attached to an electrically conductive member.

FIG. 12b is a schematic diagram of a top-down view of a flexible elongate member according to the examples of 12a;

DETAILED DESCRIPTION

Examples are herein described with reference to the accompanying drawings. In the following description, for the purpose of explanation, numerous specific details of certain examples are set forth. Reference in the specification to "an example" or similar language means that a particular feature, structure, or characteristic described in connection with the example is included in at least that one example, but not necessarily in other examples. It should further be noted that certain examples are described schematically with certain features omitted and/or necessarily simplified for ease of explanation and understanding of the concepts underlying the examples.

Examples will now be described in the context of a test lead suitable for measuring voltage and for sensing current. In a first mode the test lead is for making electrical measurements by electrically connecting to a conductive part of a circuit and in a second mode the test lead is for sensing an electromagnetic field emanating from an electrical circuit such as a current carrying cable. In particular, examples will be described of a test lead that may be supplied for use with portable meters for measuring electrical parameters such as voltage and current. The test lead may be detachable from the portable meters. For efficient use in testing of electrical parameters the test leads are flexible. However, it will be understood that examples may relate to test leads for other applications, and that examples are not restricted to use with portable electrical meters and the test leads may not be detachable from their respective apparatus.

In an example, a test lead is provided as shown in FIG. 1a, which has an insulated current-sensing coil connected at one end to a first connector for coupling to a test port of an electrical meter and at an opposing end to a second connector for coupling to an electrically conductive member, for example a probing tip, a conductor in a circuit, or other examples as will be described later. By connecting the current-sensing coil at one end to a first connector and at another end to a second connector, the current-sensing coil may provide an electrical connection between the second connector and an electrical meter connected to the connector. The current-sensing coil, being disposed about a flexible core along the length of the member, may be used for sensing current in the following way. The current-sensing coil may be positioned such that it encircles a current-carrying conductor and the voltage induced in the conductor of the current sensing coil by the magnetic field emanating from the current-carrying conductor may be measured. Where both ends of a current-sensing coil are coupled to an electrical meter a measurement of the voltage induced in the current-sensing coil will be related to the current in the current-carrying conductor.

Figure 6A:
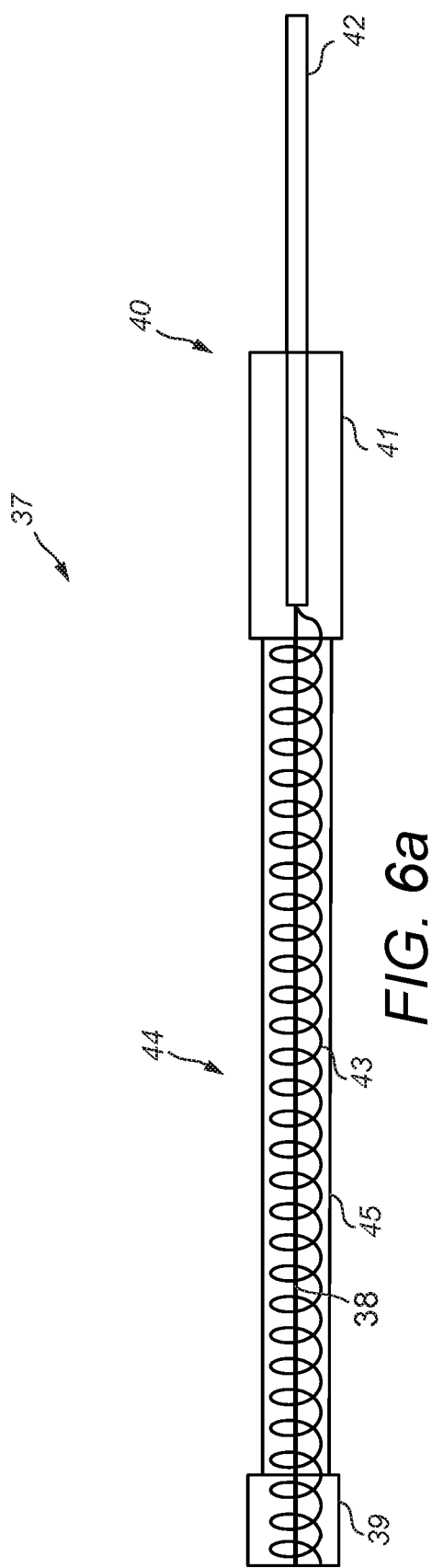
FIG. 6a is a schematic diagram of a test lead comprising a current-sensing coil and a return conductor according to examples.

In other examples such as the example shown in FIG. 6a the test lead may have a return conductor which is disposed along the length of the flexible elongate member and electrically connected to the end of the current-sensing coil at the second connector, such that both ends of the current-sensing coil are electrically connected to the first connector to allow the current-sensing coil to be used to sense current without having to electrically connect the end comprising the second connector to the meter or to another test lead. There may be many variations for each configuration, some of the possible variations are discussed later in this application. For example, there may be configurations having different types of second connectors, for coupling to a wide variety of electrically conductive members and/or suitable for connecting to a conductive part of an electrical circuit in different ways, or different apparatus for connecting to the electrical meter or to other test leads. In some examples, the electrically conductive member may be an electrical and mechanical attachment device. For example, the electrically conductive member may be a crocodile clip, a banana plug, a sprung hook or any other suitable electrical and mechanical attachment device.

In each of the examples, the test lead comprises at least a flexible elongate member comprising a current-sensing coil so that the test lead may be used as a current sensor by positioning the flexible member around a current carrying conductor under test and measuring the voltage induced in the conductor of the current-sensing coil from the electromagnetic field emanating from the current-carrying conductor.

Some electrical measurements may require a connection to be made between a conductive part of an electrical circuit under test and an electrical meter configured to perform the desired electrical test. Test leads may be used to make this electrical connection between circuits and meters. Test leads may incorporate three parts; a first connector for coupling the test lead to an electrical meter, a conductive wire for providing a current path to the first connector, and a second connector suitable for providing an electrical connection from the conductive wire to a conductive part of a circuit under test. With the first connector and the second connector attached via the conductive wire, the test lead may allow an electrical connection to be made from the first connector to the second connector. The first connector may be permanently attached or attachable to a test port of an electrical meter configured to perform an electrical test. The second connector may be permanently or removably attached to the conductive wire of the test lead. The second connector may be used to couple to electrically conductive members, for example, probing tips to provide suitable connection apparatus to conductive parts of circuits.

Measuring alternating current through a current carrying conductor may be done by sensing an electromagnetic field emanating from the conductor carrying the alternating current. This may be done by using a type of current sensor such as a Rogowski coil. A helically coiled conductor, such as those found in Rogowski coils, may be positioned around a current carrying conductor such that a portion of the flux of the magnetic field emanating from the current carrying conductor is positioned within the centre of the helical windings of the conductor in the sensor. This magnetic field induces a voltage in the helically coiled conductor which is proportional to the derivative of current in the current carrying conductor, related to the turn ratio between the helically coiled conductor and the number of turns the current carrying conductor makes around the core of the helically coiled conductor, which is equivalent to the number of times the helically coiled conductor is wound around the current-carrying conductor. By processing signals output from the helically coiled conductor it is possible to calculate the current in the current carrying conductor and hence sense the current in the current carrying conductor.

Returning to FIG. 1a, this Figure illustrates a side view of an example test lead 1 for an electrical meter in cross-section. The test lead 1 shown in FIG. 1a comprises a flexible elongate member 2, a first connector 3, and a second connector 4. The flexible elongate member 2 comprising a current-sensing coil 5 at least partially disposed about a flexible core along the length of the member. The current-sensing coil 5 in this example may be wound from copper wire. However, the current-sensing coil 5 may be wound from other conductive materials which are suitable for the function described herein. The flexible elongate member 2 may be considered a cable of the test lead 1. The flexible core has been omitted in the Figures so as not to obfuscate them. The flexible core may be constructed from a flexible insulating material for example, elastomers like silicone rubber or others. In some examples the flexible core is constructed from at least partially magnetic material, examples such as this will be described later with reference to other Figures. By constructing the core of the flexible elongate member 2 from flexible material it may be possible to bend the test lead 1 easily around a conductor carrying a current, this allows the current-sensing coil 5 to be used to sense current in current-carrying conductors. To sense the current in the conductor a current-sensing coil 5 may encircle a current carrying conductor once. To increase the sensitivity the current-sensing coil 5 may be looped around a current carrying conductor more than once. In some examples the test lead 1 may be flexible enough to loop once around a conductor for which current is to be sensed and in other examples the test lead 1 may be flexible enough to loop multiple times around the conductor.

The flexible elongate member 2 may comprise an outer insulating layer 6 made from a flexible insulating material such as silicone. This allows the test lead 1 to be safely handled by a user without allowing dangerous electrical currents to pass from a circuit under test to the user. The outer insulating layer 6 of the test lead 1 may be constructed from any suitably insulating material which allows the test lead to be suitably flexible for the function described herein.

The second connector 4 is disposed at one end of the flexible elongate member 2. The second connector 4 may be for coupling a respective end of the current-sensing coil 5 to an electrically conductive member, to provide an electrical path, via the current sensing coil, from the electrically conductive member to the first connector. In some examples, an electrically conductive member may be an electrically conductive tip, an electrical attachment mechanism, or a conductive part of a circuit to be tested. The second connector 4 shown in FIG. 1a comprises an insulating part 7 and a conductive connecting part 8. In the example of FIG. 1a, the conductive connecting part 8 is shown as a conductive receiving region for receiving an electrically conductive member, for example, an electrically conductive tip or an electrically conductive probing member. In some examples, the second connector comprises an electrically conductive tip which may be used to couple an end of the current-sensing coil to electrically conductive members, for example, the electrically conductive tip may be used to probe conductive test points of electrical circuits to be tested to couple the electrical circuits to the current-sensing coil. By connecting the second connector 4 to an electrically conductive probing member the test lead 1 may be used as a probe to connect to and make electrical measurements of electrical circuits. The current-sensing coil 5 is electrically connected to the conductive connecting part 8 of the second connector 4 such that the second connector 4 may couple an electrically conductive member to a respective end of the current-sensing coil 5. For example, the second connector 4 may couple a conductive part of an electrical circuit to the current-sensing coil 5. FIG. 1b illustrates a side view of an example test lead 1 for an electrical meter in cross-section wherein the second connector 4 is connected to an electrically conductive member 9. The electrically conductive member 9 shown in FIG. 1b is elongate and axially symmetric. This may allow the second connector and the electrically conductive member to reliably deliver electrical signals from the electrical test point of the electrical circuit to the current-sensing coil 5. By using an elongate electrically conductive member 9, the electrically conductive member 9 may be positioned or inserted into openings within which electrical test points of electrical circuits may be located which may be difficult to access with shorter or thicker conductive members. For example, components located in transformer boxes. However, the length of the conductive member 9 which is exposed beyond the insulating part 7 may be constrained by safety requirements. For example, IEC 61010 constrains the length of the exposed conductive material of a probe used in CAT III and CAT IV environments to no more than 4 millimetres. It may be possible to provide an elongate electrically conductive member which conforms to safety standards such as IEC 61010 by covering a part of the conductive member in insulating material. The insulating part 7 of the second connector 4 may be made from a suitably insulating material such as Acrylonitrile Butadiene Styrene (ABS) which provides sufficient rigidity to allow a user to hold the insulating part 7 when engaging the second connector 4 with an electrically conductive member, for example, a probing tip or a conductive part of an electrical circuit. If the insulating part 7 of the second connector 4 is too flexible it may be difficult to operate use the second connector 4 with sufficient precision such as in situations where a user may use the second connector 4, with an attached electrically conductive member 9, to make contact between the attached electrically conductive member 9 and a test point of the electrical circuit to be tested.

The second connector 4 may be removably attached to the flexible elongate member 2 such that the second connector 4 is detachable from the test lead 1. This may allow the second connector 4 to be replaced with a different type of electrical connection device for example; a Bayonet Neill-Concelman (BNC) connector, a crocodile clip, a sprung hook probe, any other type of device suitable for electrically connecting the current-sensing coil 5 to an electrical test point.

The first connector 3 may be disposed at an end of the member 2 for coupling a respective end of the current-sensing coil to a test port of an electrical meter. In an example, the first connector 3 may provide an electrical connection between at least one conductor of the flexible elongate member 2, for example the current-sensing coil 5, and electronic components in the electrical meter which are used to perform the measurements of the electrical properties to be measured such as current and voltage. The first connector 3 may comprise a portion of insulating material and a portion of conductive material. The insulating material may be positioned on an outer layer of the first connector 3 to protect a user when operating the first connector 3. The conductive material may be positioned internally and may be configured to provide an electrical connection between a conductor of the flexible elongate member 2 and the electrical meter. An example of a connector may be a banana type connector (plug or socket) or a BNC connector. The first connector 3 may be permanently or removably attached to a test port of the electrical meter. The first connector 3 may be permanently or removably attached to other components of the test lead 1 and may be connectable to an electrical meter which is configured to perform electrical tests such as current-sensing or direct voltage measurements of electrical circuits. In some examples, the first connector 3 may couple an end of the current-sensing coil 5 with a test port of an electrical meter without providing a direct electrical connection. These examples will be described later.

Figure 1C:
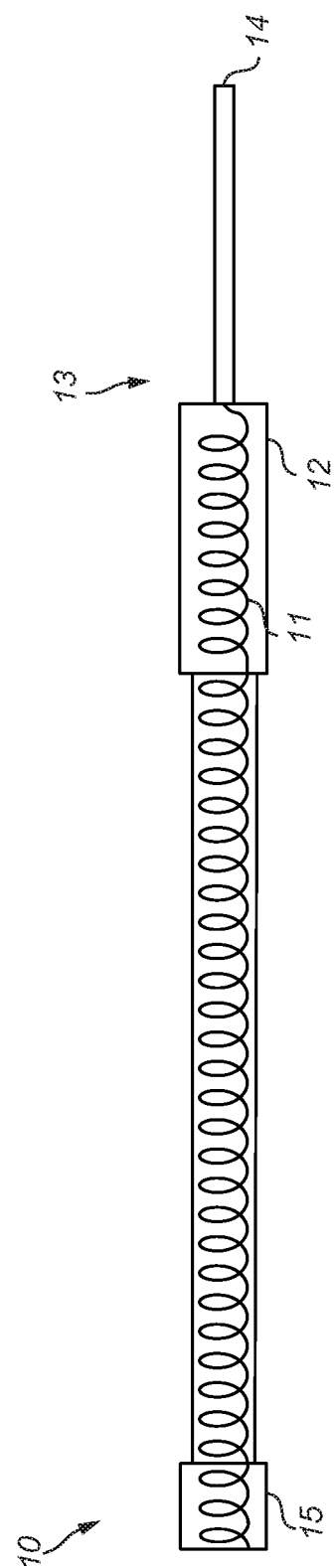
FIG. 1c is a schematic diagram of a test lead according to examples wherein a current-sensing coil extends into an insulating part.

FIG. 1c shows schematically an example test lead 10 in a cross-sectional view. The example according to FIG. 1c is similar to the example of FIG. 1b except that at least part of the current sensing coil 11 is disposed within the insulating part 12 of the second connector 13. The second connector 13 shown in FIG. 1c is connected to an electrically conductive member 14 such that the current-sensing coil 11 is coupled to the electrically conductive member 14. Thereby, an electrical path is provided, via current-sensing coil 11, from the electrically conductive member 14 to the first connector 15.

Figure 2:
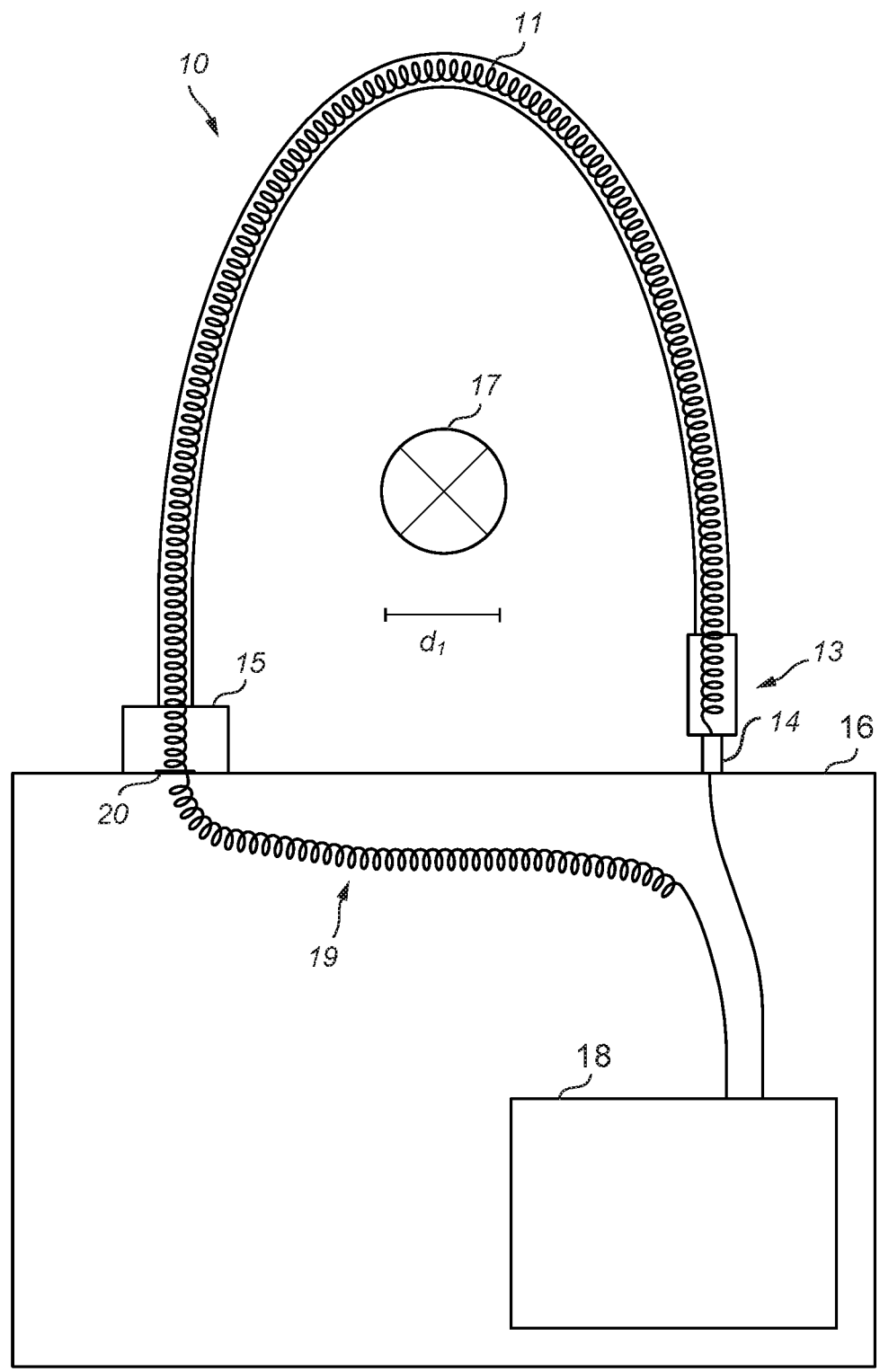
FIG. 2 is a schematic diagram of a test lead and an electrical meter configured to sense a current in a current-carrying conductor according to examples.

FIG. 2 shows an electrical meter 16 connected to a test lead 10, according to the example of FIG. 1c, configured to sense the current travelling through a current carrying conductor 17. The current carrying conductor 17 is a cable with diameter $d_1$ travelling into the plane of the page. With the test lead 10 positioned around the current carrying conductor 17 and with the two ends of the current-sensing coil 11 coupled to the electrical meter 16, a voltage is induced in the current-sensing coil 11 which is proportional to the derivative of the current in the current-carrying conductor 17. This voltage may be measured in the electrical meter 16 by circuitry 18 and a determination of the current in the current-carrying conductor 17 may be made. When sensing current in a current carrying conductor 17 using a test lead 10 as shown in FIG. 2, the accuracy of the measurement may be related to the distance between the current carrying conductor 17 and the opening between the ends of the current-sensing coil 11. In examples using one test lead 10, such as that shown in FIG. 2, with the test lead 10 positioned around a current carrying conductor 17, the conductor 17 may be positioned distally from the opening between the ends of the current-sensing coil 11. In the examples shown in FIG. 2, the first connector 15 is attached to a first test port of the electrical meter 16 and the second connector 13 is connected to a second test port of the electrical meter 16. In the example of FIG. 2, the second connector 13 is connected to an electrically conductive member 14 and is connected to the second port of the electrical meter 16 via this member 14. In other examples, the second connector 13 may directly connect to a test port of the electrical meter 16. In such examples, the test port of the electrical meter may be considered as or may comprise an electrically conductive member. The second connector 13 may comprise any suitable connection apparatus. For example, the second connector 13 may be a banana plug type connector which allows secure electrical connection with the electrical meter 16. Other ways of electrically connecting the end of the current-sensing coil 11, where the second connector 13 is disposed, to the electrical meter 16 are possible.

The accuracy of current-sensing using a test lead is affected by the size of the opening between the ends of the current-sensing coil 11. In the example of FIG. 2, helical windings 19 inside the electrical meter 16 are used to reduce the gap between the ends of the current-sensing coil 11. In the example of FIG. 2 there is an electrical connection at point 20 which connects the current-sensing coil 11 to the helical windings 19 in the electrical meter 16 via the first connector 15. In other examples, this may be achieved by having the first connector 15 of the test lead 10 permanently attached to the electrical meter 16 such that a single conductor is used for the helical windings 19 in the electrical meter and for the helical windings in the current-sensing coil 11 of the flexible elongate member. The second connector 13 is electrically connected to the electrical meter 16 and a conductive path is provided from both ends of the test lead 10 to circuitry 18 in the electrical meter 16.

The winding density, the diameter, and the rigidity of the windings in a current-sensing coil may affect the current-sensing coils immunity to external fields and sensitivity to the position of the current-carrying conductor under test.

The circuitry 18 in the electrical meter 16 may be configured to process output signals from the test lead 10 to determine the current in the current-carrying conductor 17. The circuitry 18 may comprise a combination of hardware and program code to process signals. In some examples, not shown in FIG. 2, the first test port where the first connector 15 of the test lead 10 connects to the electrical meter and the second test port where the second connector 13 connects to the electrical meter 16 may be positioned in close proximity to one another in the electrical meter 16 such that the magnetic loop in the flexible elongate member may be completed without the use of helical windings 19 in the electrical meter 16.

Figure 3B:
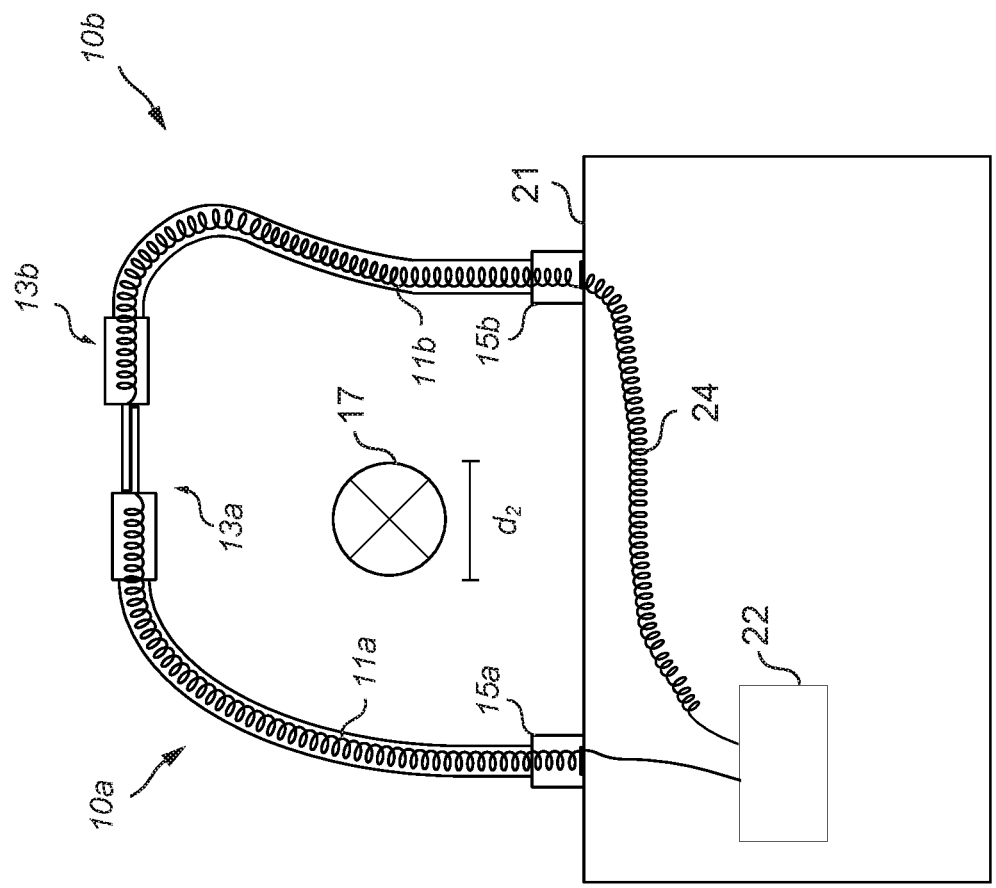
FIG. 3b is a schematic diagram of two test leads connected to an electrical meter in a current-sensing mode according to examples.
Figure 3A:
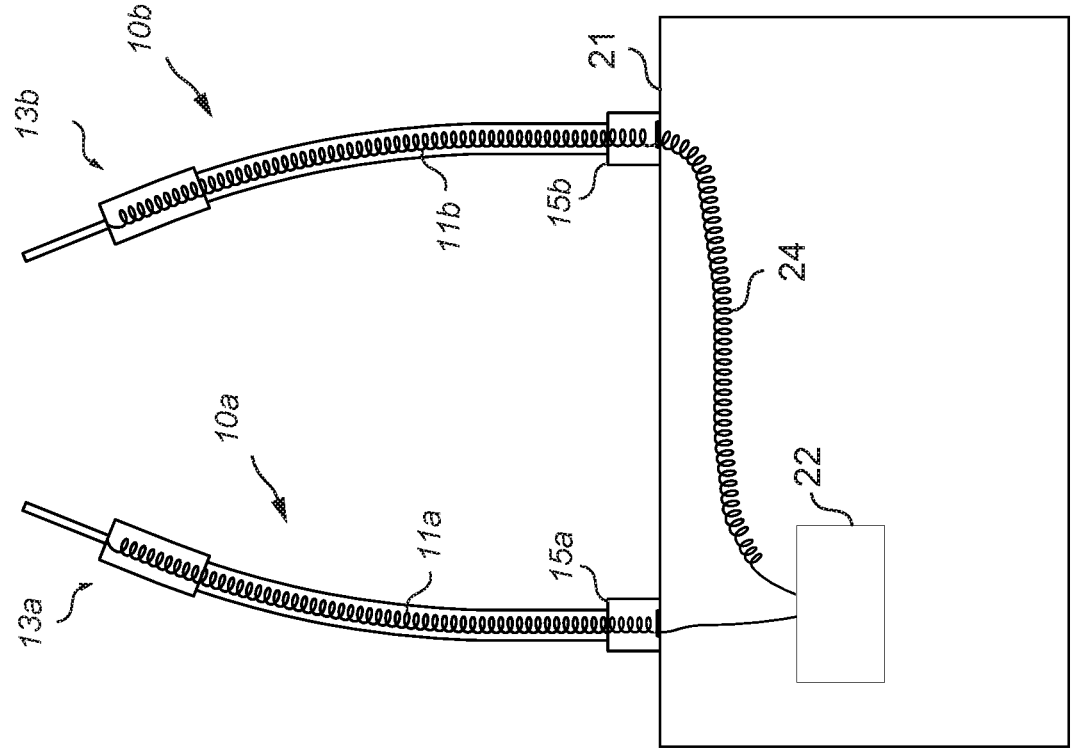
FIG. 3a is a schematic diagram of two test leads connected to an electrical meter in a probing mode according to examples.

FIGS. 3a and 3b show an electrical meter 21 with two test leads 10a, 10b according to an example. The two test leads 10a, 10b in FIGS. 3a and 3b are each test leads according to examples of FIG. 1c. In FIG. 3a, the two test leads 10a, 10b are configured to be used as test leads suitable for measuring electrical properties such as voltage and current in electrical circuits by probing conductive parts of the circuits to be tested. The two test leads 10a, 10b each comprise a second connector 15a, 15b. The second connectors may comprise a conductive tip for coupling an electrically conductive member to the current-sensing coils 11a, 11b. For examples, for coupling a conductive test point of a circuit to be tested by probing the conductive tip onto the test point. The first connectors 15a, 15b are connected to the electrical meter 21 which is configured to measure the electrical property to be tested using a combination of circuitry 22 and program code. Generally, test leads are configured to deliver electrical signals from conductors in electrical circuits to electrical meters, the conductive path being provided by a straight or braided wire or wires. In this example the conductive path is provided by the helically coiled conductor in the current-sensing coils 11a, 11b of the test leads 10a, 10b. Using a helically coiled conductor to provide the conductive path in the test lead may result in greater noise and/or inductance which may affect the signals which are delivered to the electrical meter 21 through the test lead 10a, 10b from the conductive part of the electrical circuit to the electrical meter. This may be compensated for in the electrical meter 21.

For example, the electrical meter 21 may perform a calibration in which, with the test leads 10a, 10b connected to respective test ports of the electrical meter and with the second connectors 13a, 13b electrically connected to one another, the noise signature of the test leads 10a, 10b may be recorded. This noise signature may then be subtracted from the measured signal when the test leads 10a, 10b are used for measuring voltage such as in the configuration of FIG. 3a.

In examples such as those in FIGS. 3a and 3b, in which the electrical meter 21 comprises internal helical windings 24, a voltage drop may be measured across the windings 24, and as any significant voltage in this part may be attributed to noise due to a magnetic field, appropriate compensation may be calculated and extrapolated to take into account the whole test lead.

In other examples, compensation may not be used to account for the noise and/or inductance, generated when using a helically coiled conductor to provide a conductive path in the test lead when performing electrical measurements by probing. For example, when used in high voltage applications the noise generated due to the helically coiled conductor may be insignificant in comparison to the measured voltage signal. For example, an electrician working with mains voltage may be taking measurements on the order of tens to hundreds of volts, whereas the signal which arises due to a magnetic field in the test lead may only be on the order of millivolts and so will be statistically insignificant to the electrician's measurement.

In FIG. 3b, the two test leads 10a, 10b are configured to sense the current in a current-carrying conductor 17. The current carrying conductor 17 has diameter $d_2$ and extends into the plane of the page. The second connectors 13a, 13b of the test leads may be held such that they are in electrical contact with one another. For example, the second connectors may be held such that a conductive part of each second connector is in contact with a conductive part of the other second connector. In some examples, the second connectors 13a, 13b may comprise conductive tips and the two second connectors 13a, 13b may be held such that the conductive tips are in electrical contact. In other examples, at least one of the second connectors may be coupled with an electrically conductive member. In examples where one of the second connectors 13a or 13b is coupled to an electrically conductive member, the other second connectors may be coupled to an opposing end of the electrically conductive member. The second connectors 13a, 13b of the test leads may be held in electrical contact, for example as shown in FIG. 3b, manually or may be connected with a mechanism. In the example according to FIG. 3b, the test leads 10a, 10b are in mechanical and electrical contact. The current-sensing coils 11a, 11b inside the test leads 10a, 10b are electrically connected to allow a voltage induced in the current-sensing coils 11a, 11b by the magnetic field emanating from and proportional to the current in current-carrying conductor 17 to be measured by the electrical meter 21. Within the electrical meter 21 there is shown to be a helically wound conductor 24 extending from the test port of the electrical meter connected to the connector 15b of one test lead 10b towards the test port of the electrical meter connected to the other connector 15a of the other test lead to reduce the gap between the ends of the current-sensing coils 11a, 11b. In other examples there may be helically wound conductors extending from and electrically connected to the connectors 15a, 15b of each of the tests leads 10a, 10b within the electrical meter 21. This may be to reduce the gap between the ends of the current-sensing coils 11a, 11b in the test leads 10a, 10b. By reducing the size of the gap between the ends of the two current-sensing coils when connected to the electrical meter 21 it is possible to perform the current-sensing measurement with greater accuracy. In still more examples there may be no helically wound conductor in the electrical meter 21 but instead, to reduce the gap between the ends of the current-sensing coils 11a, 11b, the test ports of the electrical meter 21 which connect to the connectors 15a, 15b of the test leads 10a, 10b may be positioned close to each other such that the gap between the ends of the current-sensing coils 11a, 11b at the electrical meter 21 is sufficiently small to allow closure of the magnetic loop.

A current carrying conductor 17 will have an electromagnetic field emanating from it. With the two test leads 10a, 10b connected to the meter 21 at their connectors 15a, 15b and electrically connected to one another at their respective second connectors 13a, 13b a portion of the magnetic flux of this field will be within the core of the current-sensing coils 11a, 11b of the test leads 10a, 10b. The strength of the magnetic field is related to the current in the current carrying conductor 17. The magnetic field within the core of the current-sensing coils 11a, 11b will induce a voltage across the conductors of the current-sensing coils 11a, 11b in the test leads 10a, 10b. This voltage may be measured by a combination of circuitry 22 and program code in the meter 21. The current in the current-carrying conductor 17 may be derived as the induced voltage is proportional to the derivative of the current in the current-carrying conductor 17.

FIG. 4 shows a cross section of an example second connector 25 connected to an end of a flexible elongate member 26. At least part of the current-sensing coil 27 is disposed within the insulating part 28 of the second connector 25. The second connector 25 comprises a conductive tip 29 having a pointed end for coupling an electrically conductive member, such as an electrical connection to a test point of an electrical circuit, to the current-sensing coil 27. As discussed in relation to FIGS. 3a and 3b, the accuracy of a current-sensing coil is affected by the size of the gap between the ends of the magnetic loop. Having the current-sensing coil 27 extend within the insulating part 28 of the second connector 25 may reduce this gap and thereby increase the accuracy of the measurement.

Figure 4A:
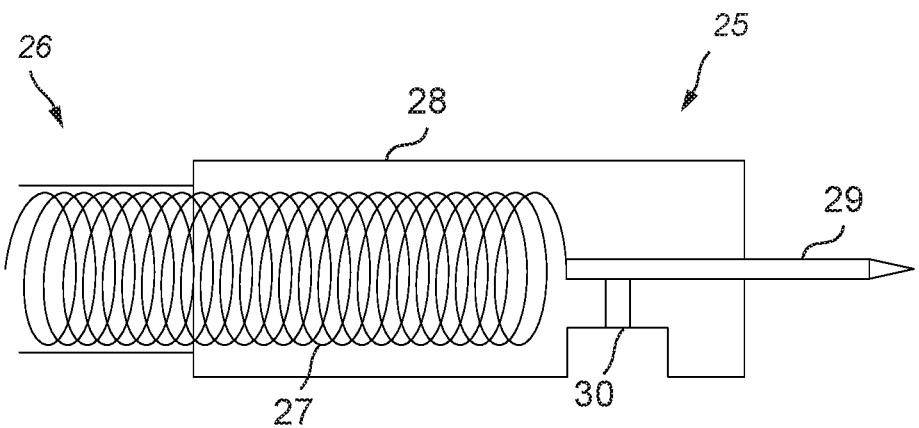
FIG. 4a is a schematic diagram of an example second connector.

The pointed metal end of the conductive tip 29 of the second connector 25, shown in FIG. 4a, may be used to make contact with a conductive test point in an electrical circuit. Conductive parts of electrical circuits may become covered in layers of oxidised material, thereby reducing the ability to make electrical connections by contact with the surface of the conductive parts. Hence, providing a conductive tip 29 with a pointed end may allow the conductive tip 29 to pierce a layer of oxidation on the surface of a conductive test point of a circuit and thereby to make an electrical connection with a conductive test point.

In other examples the end of the conductive tip 29 may not be pointed. For example, some components which are to be tested may become damaged or may be compromised if a pointed end is used to make contact. In these cases, it may be preferred to use a rounded tip.

Figure 4B:
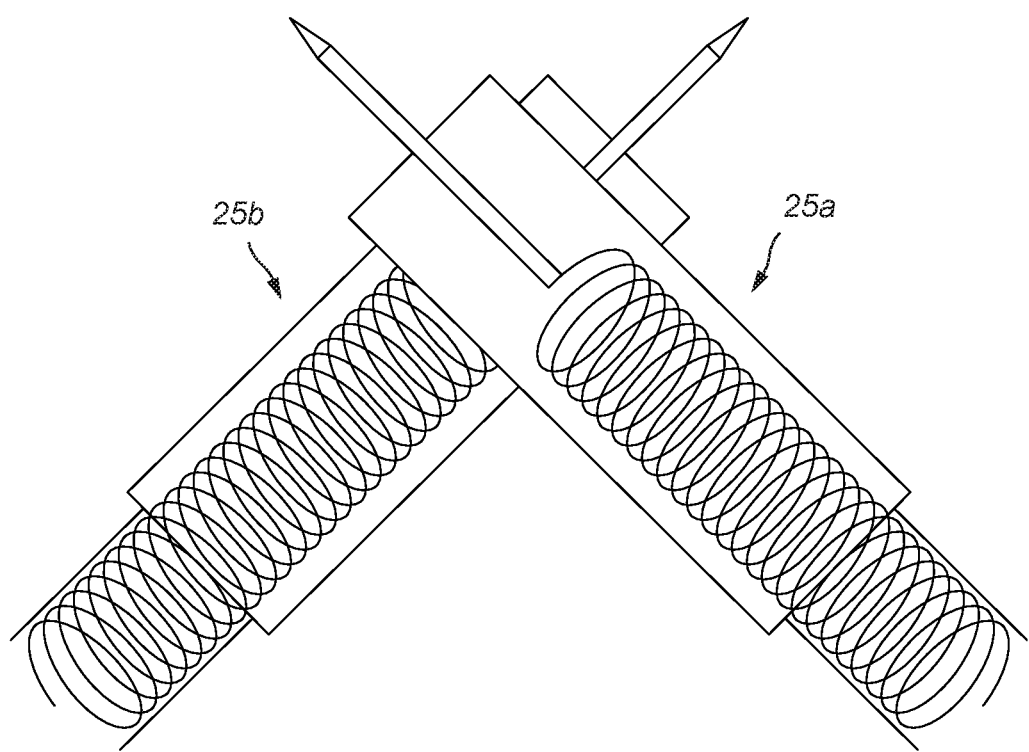
FIG. 4b is a schematic diagram of two second connectors according to FIG. 4a, electrically connected to one another.

In some examples, when sensing a current using two test leads, the leads may be configured such that the current-sensing coils are in electrical contact via the second connectors. The example according to FIG. 4a shows a second connector 25 with an exposed surface of a conductor 30 to make electrical connection with another second connector. The second connector 25, shown in FIG. 4a, comprises an exposed surface of a conductor 30 at a recessed part of the insulating part of the second connector 25. This conductor 30 is electrically connected to the conductive tip 29 and to the current-sensing coil 27 of the flexible elongate member 26. FIG. 4b shows two such second connectors 25a, 25b electrically connected by contacting the respective exposed surfaces of their conductors. The electrical connection between the second connectors is obscured in FIG. 4a as one connector 25b is below and interlocked with the other connector 25a. In examples where both connectors 25a, 25b comprise an exposed conductor in a recessed part of the respective connector 25a, 25b the two exposed conductors may be held in electrical contact such that the connectors 25a, 2b are interlocked. This may allow a conductive path to be provided from a current-sensing coil of one test lead to the current-sensing coil of another test lead. In some examples, at least one second connector 25a, 25b comprises an electrical and mechanical attachment part for coupling the respective end of the current-sensing coil to the second test lead, to provide an electrical path, via the current-sensing coil, from the first connector to a further current sensing coil of a second test lead. There may be mechanical attachment parts to hold the two connectors 25a, 25b in a configuration wherein the exposed conductors are electrically connected. The exposed conductors may be positioned within a recess of a connector 25 to reduce the possibility of a user making electrical contact with the exposed conductor when taking measurements of electrical properties. This may also reduce interference when taking electrical measurements.

Figure 5A:
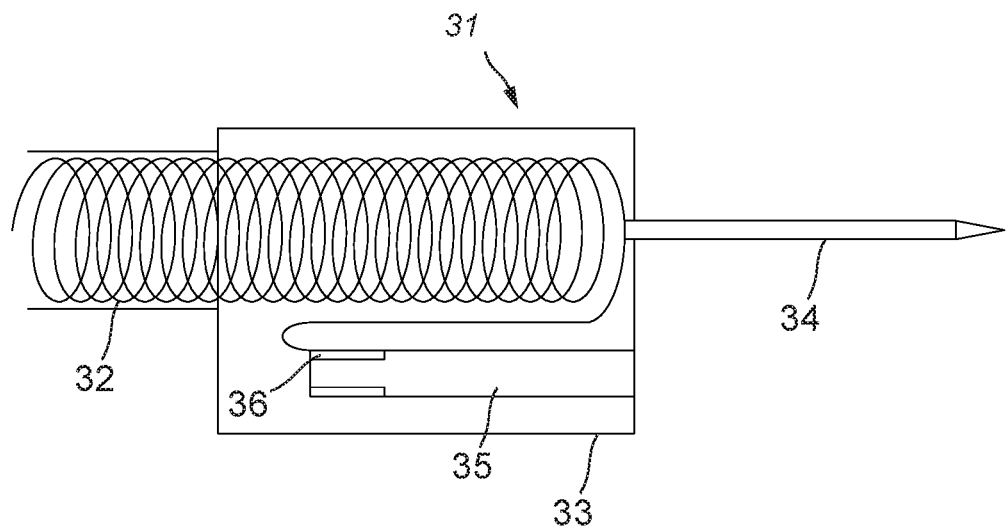
FIG. 5a is a schematic diagram of an example second connector.

FIG. 5a shows a cross section of a second connector 31 of a test lead according to examples. The current-sensing coil 32 of the test lead extends within the second connector 31. The second connector 31 comprises an insulating part 33 and a conductive tip 34. In other examples, the second connector 31 may not comprise a conductive tip 34 but may be connectable to a conductive tip 34. The second connector 31 comprises an electrical and mechanical attachment 35 part for electrical and mechanical connection of the second connector 31 to a further second connector. This may allow the second connector 31 to mechanically and electrically connect to another test lead.

In the example of FIG. 5a, the electrical and mechanical attachment part 35 comprises a receiving portion for receiving a conductive tip of a further second connector or for receiving an electrically conductive member connected to a further second connector. The receiving portion comprises at least one electrical contact 36 to electrically connect with a conductive tip of a further second connector or an electrically conductive member. The electrical contact 36 may be electrically connected to the current-sensing coil in the test lead, as shown in FIG. 5a.

Figure 5B:
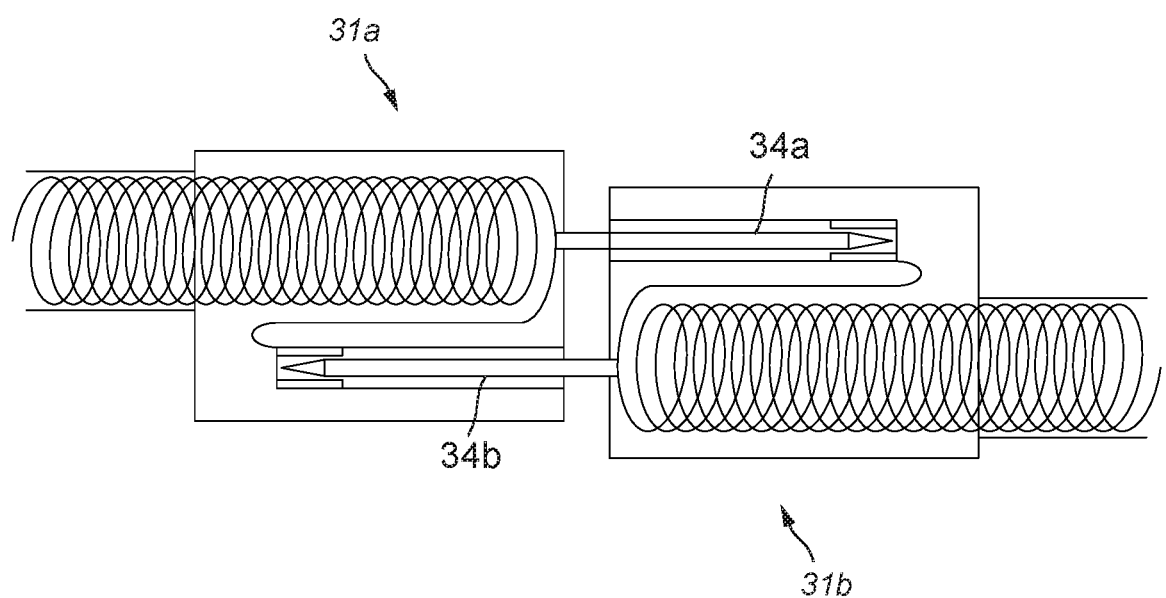
FIG. 5b is a schematic diagram of two second connectors according to FIG. 5a, electrically connected to one another.

FIG. 5b shows the second connectors 31a, 31b of two test leads each according to the example of the test lead 31 FIG. 5a, in an attached configuration. The conductive tips 34a, 34b of each connector are received by the receiving portion of the opposing connector 31b, 31a respectively. In some examples, only one connector comprises a receiving portion. A conductive tip 34a, 34b of a connector 31a, 31b may be detachable or retractable into the insulating part of the connector 31a, 31b.

The receiving portion of a connector 31 may comprise an attaching mechanism for example, clips, resilient members or other suitable mechanisms for securely holding a conductive tip of a further connector, or an electrically conductive member, within the receiving portion. Similarly, a conductive tip 34 may comprise an attaching mechanism to securely hold the conductive tip 34 within a receiving portion of a connector.

Figure 6B:
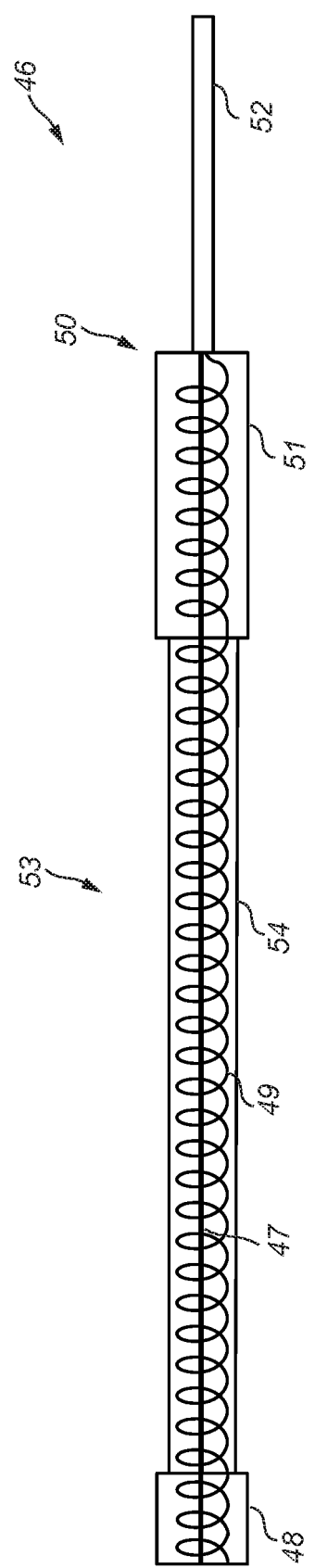
FIG. 6b is a schematic diagram of a test lead comprising a current-sensing coil and a return conductor extending within an electrically conductive probe according to examples.
Figure 6C:
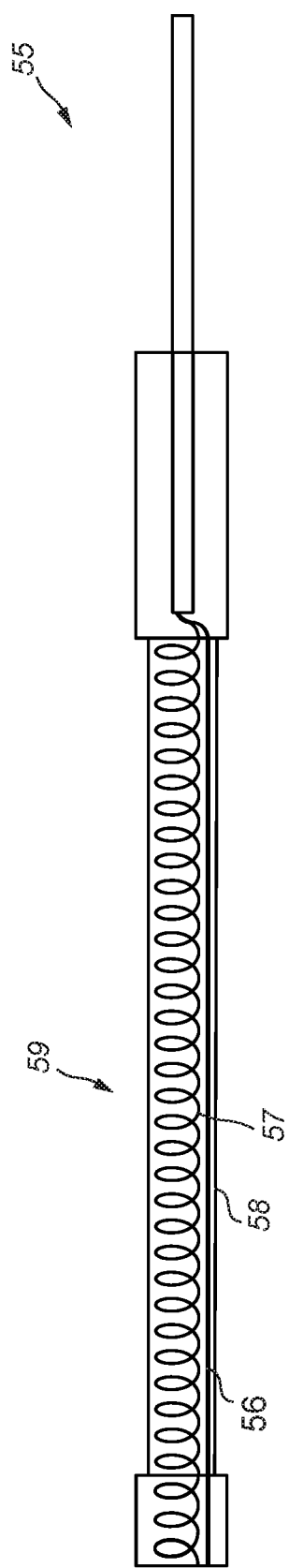
FIG. 6c is a schematic diagram of a test lead comprising a current-sensing coil and a return conductor according to examples.

FIG. 6a shows a cross section of a test lead 37 according to examples similar to the test lead of FIG. 1b but also comprising a return conductor 38 disposed along the length of the flexible elongate member. The test lead 37 shown in FIG. 6a comprises a first connector 39. The first connector 39 may be for coupling a respective end of the return conductor 38 to a test port of an electrical meter. The test lead 37 comprises a second connector 40 for coupling a respective end of the return conductor to an electrically conductive member 42, to provide an electrical path, via the return conductor, from the electrically conductive member 42 to the first connector 39. In an example, the first connector 39 provides a first electrical connection from the return conductor 38 to the electrical meter and a second electrical connection from the current-sensing coil 43 to the electrical meter. The connector 39 is configured to mechanically and electrically attach the test lead 37 to an electrical meter. The second connector 40 comprises an insulating part 41 and is attached to an electrically conductive member 42 which in this example is a conductive tip, wherein the conductive tip 42 is electrically connected to at least one of the current-sensing coil structure 43 and the return conductor 38 in the flexible elongate member 44. The flexible elongate member 44 comprising an insulating outer layer 45. FIG. 6b shows a side view of a test lead 46 in cross-section according to examples similar to the example of FIG. 1c but also comprising a return conductor 47. The test lead of FIG. 6b comprises a first connector 48 to provide a first electrical connection from the return conductor 47 to the electrical meter and a second electrical connection from a current-sensing coil 49 to the electrical meter. The connector 48 is configured to mechanically and electrically connect the test lead 46 to an electrical meter. However, in some examples the connector 48 may not electrically connect the test lead 46 to the electrical meter, alternative methods of coupling the test lead 46 to the electrical meter will be discussed later. The test lead 46 comprises a second connector 50 comprising an insulating part 51 and attached to an electrically conductive member, which in this case is a conductive tip 52, wherein the conductive tip 52 is coupled to at least one of the current-sensing coil 49 and the return conductor 47 which extend into the insulating part 51. The current-sensing coil 49 and the return conductor 47 from part of a flexible elongate member 53 also comprising an insulating outer layer 54. In the examples according to FIGS. 6a and 6b, the current-sensing coil is a helically coiled conductor wound around the return conductor. FIG. 6c shows a test lead 55 similar to the test lead 1 of FIG. 1a but also comprising a return conductor 56 wherein the return conductor 56 is positioned externally to current-sensing coil 57 and within an insulating outer layer 58 of a flexible elongate member.

Test leads according to examples comprising flexible elongate members comprising a current-sensing coil and a return conductor, wherein the current-sensing coil and the return conductor are electrically connected at the distal end of the test lead from the first connector, as shown in FIGS. 6a, 6b, and 6c, may be used to sense current in a similar manner to a Rogowski coil. A test lead having a current-sensing coil and a return conductor which are electrically connected at a second connector disposed at an end of the flexible elongate member may be attached to an electrical meter at the first connector. The current-sensing coil may be positioned such that it encircles a current-carrying conductor and thereby a voltage proportional to the derivative of the current may be induced in the current-sensing coil and the return conductor. The voltage may be measured by circuitry in the electrical meter to determine the current in the current-carrying conductor. To induce a voltage in the current-sensing coil and the return conductor proportional to the derivative of the current in the current-carrying conductor the magnetic loop of the current-sensing coil is completed. This may be implemented by holding the test lead in a circular formation around the conductor. In some examples, a mechanical attachment mechanism may be used at the second connector to ensure that the magnetic loop is closed. In some examples at least one of the second connectors may comprise a mechanical attachment part. The mechanical attachment part may be for coupling the respective end of the test lead to the second test lead. In some examples, the mechanical attachment part may comprise a first part of a mechanical attachment part attached to one second connector and a second part attached to a further second connector. For example, the mechanical attachment part may be a press fit connector for securing a second connector to a further second connector. The mechanical attachment part may comprise a strap, a clip, a slide locking mechanism or any other suitable mechanical attachment part for securing a first connector to a second connector.

Figure 7:
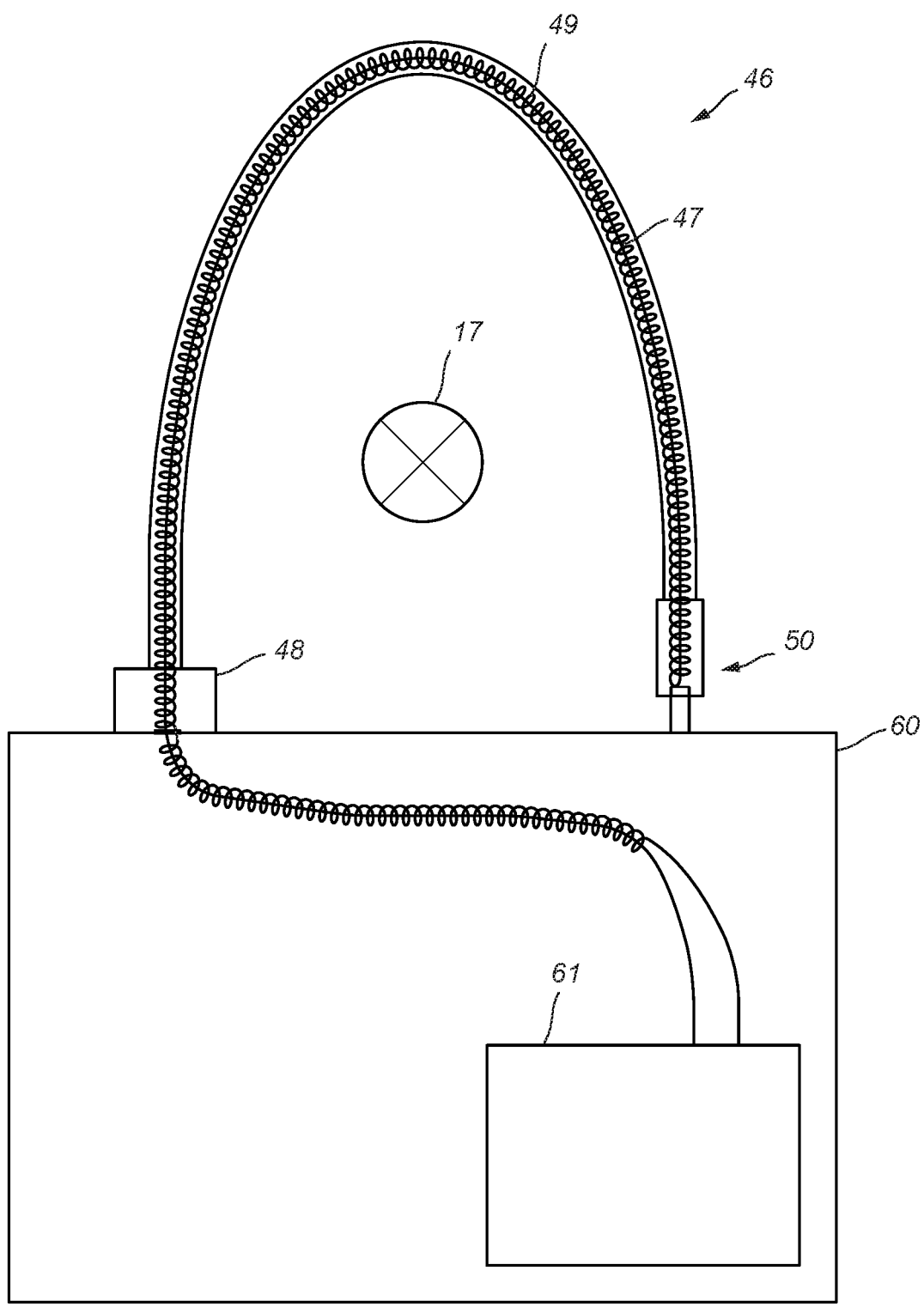
FIG. 7 is a schematic diagram of test lead according to FIG. 6b and an electrical meter in a current-sensing mode.

FIG. 7 shows a test lead 46 according to the example of FIG. 6b, configured to sense the current in a current-carrying conductor 17. The first connector 48 of the test lead 46 is connected to an electrical meter 60. The electrical meter 60 is similar to the electrical meters in previous Figures. However, the electrical meter 60 comprises circuitry 61 configured to attach to both the current-sensing coil 49 and the return conductor 47 of the test lead 46. The second connector 50 is mechanically attached to the port of the electrical meter 60. As in previous Figures, to reduce the gap between the ends of the current-sensing coil, the electrical meter 60 may comprise helical windings internally. When in the configuration shown in FIG. 7, the return conductor 47 and the current-sensing coil 49 are electrically connected to circuitry 61 in the electrical meter which may measure a voltage proportional to the derivative of the current in the current-carrying conductor 17 and thereby determine the current in the current-carrying conductor 17. Any of the test leads according to the examples of FIGS. 6a, 6b, and 6c may be used in the configuration shown in FIG. 7 to sense current in the current-carrying conductor 17.

In some examples of test leads comprising current-sensing coils and return conductors, the current-sensing coil and the return conductor may be isolated from one another in the test lead. For example, the second connector for coupling a respective end of the current-sensing coil to an electrically conductive member may comprise a switching mechanism to select between a current-sensing mode and an electrical probing mode. In the current-sensing mode the current-sensing coil may be electrically connectable to an electrically conductive member and the return conductor may be electrically isolated from the current-sensing coil in the test lead. Alternatively, in the current-sensing mode the current-sensing coil and the return conductor may be electrically connected to one another. In the electrical probing mode, the return conductor may be electrically connectable to an electrically conductive member, for example, the return conductor may be electrically connected to an exposed conductor of the second connector to attaching to electrically conductive members, and the current-sensing coil may be electrically isolated from the return conductor in the test lead. By isolating the current-sensing coil from the return conductor when using the test lead in the electrical probing mode, interference and/or inductive effects due to the current-sensing coil may be reduced.

In some examples, the test lead may comprise a current-sensing coil and a return conductor which are electrically isolated such that the test lead may be used in four-terminal sensing measurements. The second connector may be for coupling the respective end of the current-sensing coil to an electrically conductive member, to provide a first electrical path, via the current-sensing coil, from the electrically conductive member to the first connector, and for coupling a respective end of the return conductor to a second electrically conductive member, to provide a second electrical path, via the return conductor, from the second electrically conductive member to the first connector. For example, the second connector may comprise two conductive connecting parts, wherein one electrically conductive connecting part is electrically connected to the current-sensing coil and the other electrically conductive connecting part is electrically connected to the return conductor. Two such test leads may be used to provide separate pairs of current-carrying and voltage-sensing electrodes. Four-terminal sensing may also be referred to as 4-wire sensing or a 4-point probe measurement. The four-terminal sensing measurement uses separate pairs of current-carrying and voltage-sensing electrodes. The four-terminal sensing method may be used to measure resistance while eliminating lead and contact resistance.

Figure 8A:
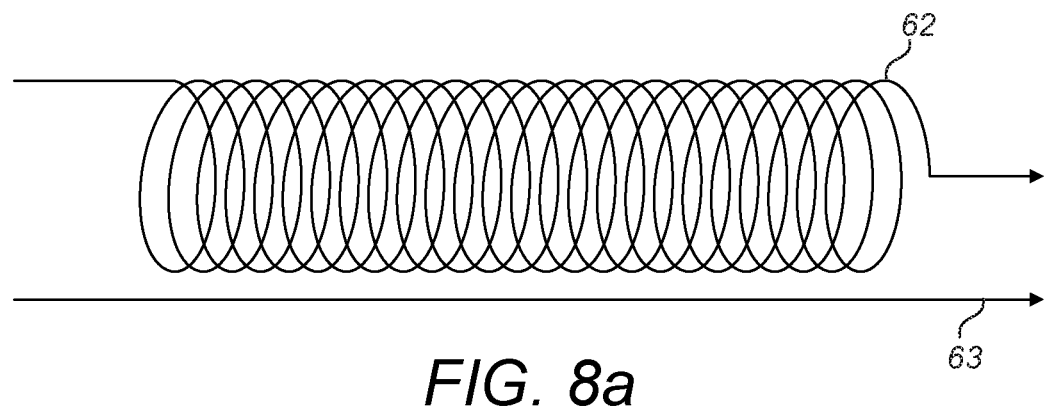
FIG. 8a is a schematic diagram of an arrangement of a current-sensing coil and a return conductor according to examples.

FIG. 8a shows a configuration of the current-sensing coil 62 and the return conductor 63 within a flexible elongate member according to examples. In the example of FIG. 8a the return conductor 63 is positioned externally to the current-sensing coil 62. Both the current-sensing coil 62 and the return conductor 63 are configured to provide an electrical connection between their respective ends. Other components of the test lead are not shown in FIG. 8a for simplicity. In some examples the second connector for coupling the current-sensing coil to an electrically conductive member comprises a first conductive tip connectable to the current-sensing coil 62 and a second conductive tip connectable to the return conductor 63, and the first conductive tip and the second conductive tip are isolated from one another in the test lead as shown in FIG. 8a. One of the first conductive tip or the second conductive tip may be configured to provide a current from an electrical meter connected to the first connector. The other of the first conductive tip or the second conductive tip may be configured to sense a voltage at the respective tip. By using two such test leads it may be possible to perform a 4-wire sensing measurement of resistance. The current-sensing coil 62 may be used for sensing current as in previous examples.

Figure 8B:
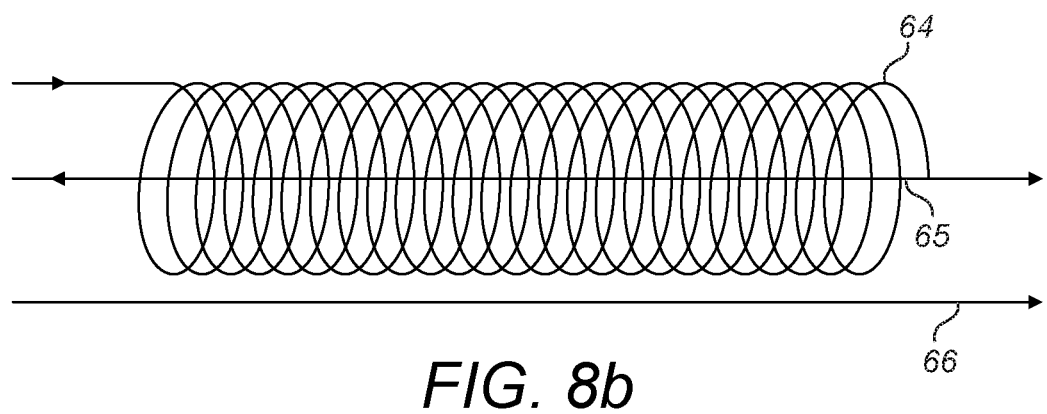
FIG. 8b is a schematic diagram of a current-sensing coil and two return conductors according to examples.
Figure 8C:
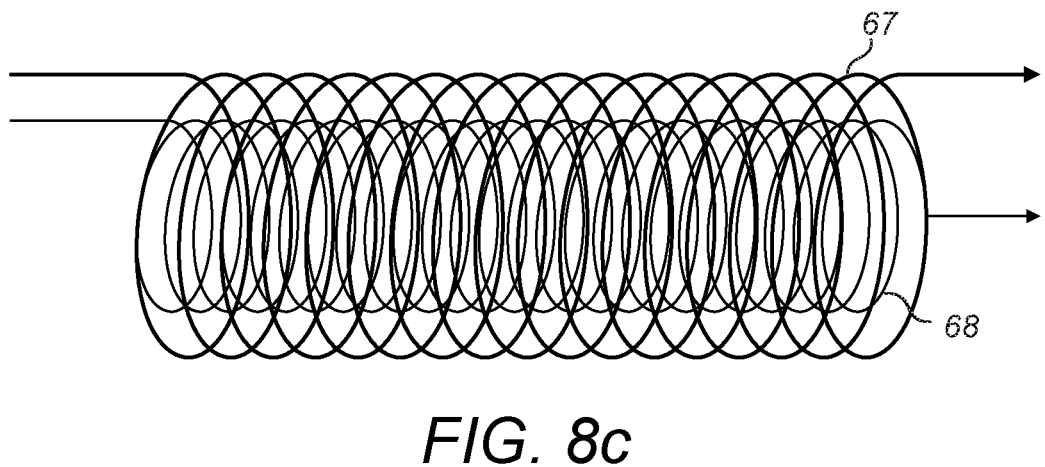
FIG. 8c is a schematic diagram of a current-sensing coil and a return conductor comprising helical windings according to examples.
Figure 9:
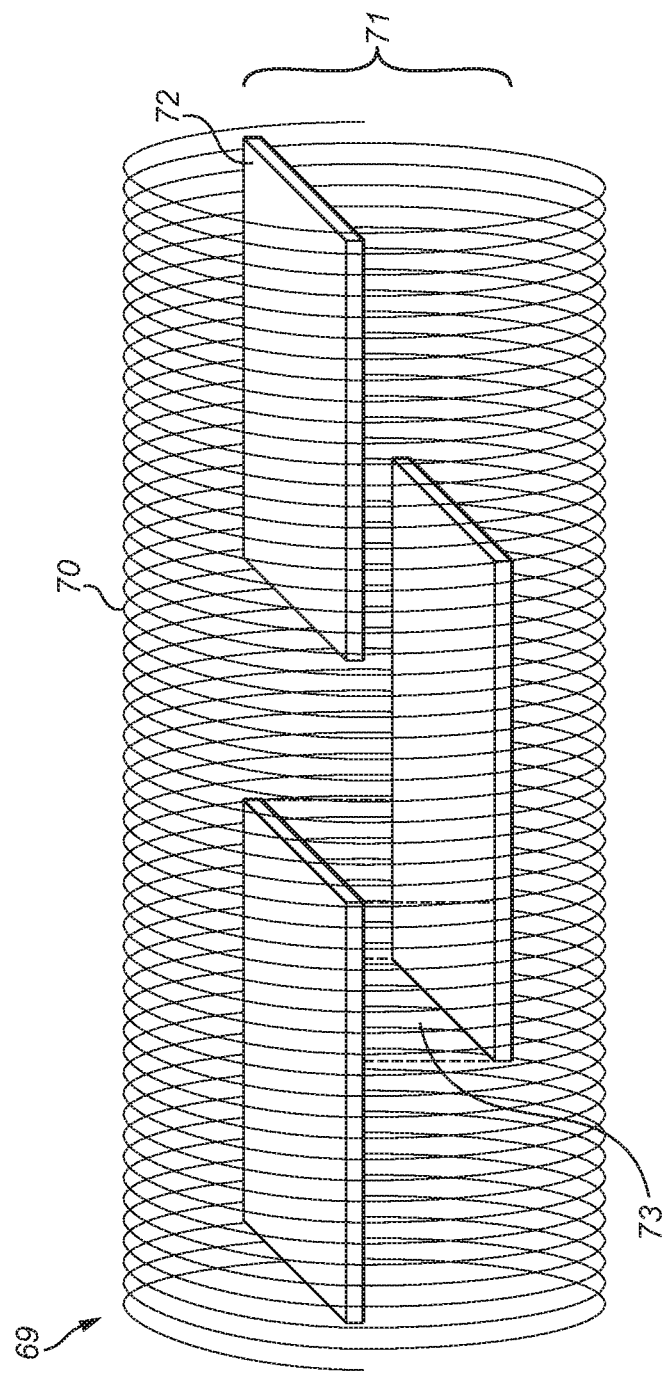
FIG. 9 is a schematic diagram of a perspective view of a flexible elongate member according to examples.

Other configurations of the current-sensing coil and the return conductor or multiple return conductors may be possible. For example, FIG. 8b shows an example comprising a current-sensing coil 64 comprising an electrically connected return conductor 65, and an electrically isolated return conductor 66. The current-sensing coil 64 and the connected return conductor 65 may be used to sense current as in the example of FIG. 7. Having the electrically isolated return conductor 66 also allows the test lead comprising this configuration of return conductors 65, 66 and current-sensing coil 64 to be used in a 4-wire sensing measurement. Another possible configuration is shown in FIG. 8c comprising a first current-sensing coil 67 and a return conductor 68 wherein the return conductor 68 is a second coil having a smaller diameter than the first current-sensing coil 67 and positioned within the core of the first current-sensing coil 67. In other examples, the return conductor 68 as a second coil, may be interleaved or wound in a bifilar configuration with the first current-sensing coil 67 and may have the same diameter as the first coil 67. Other configurations of the two coils are also possible.

In the examples described above, the first connector for coupling the respective end of the current-sensing coil to the test port of the electrical meter has been described as providing an electrical connection between the current-sensing coils of the test lead and the test port of the electrical meter and in some cases providing two electrical connections, one for the current-sensing coil and one for the return conductor. However, in other examples the first connector may not be configured to provide an electrical connection between the test lead and the electrical meter. In some examples, the first connector may comprise a transmitter to transmit a signal from the test lead to the electrical meter. For example, the first connector may comprise an optocoupler to transfer signals indicative of the voltage in the test lead to the electrical meter. In other examples, the first connector may comprise a tuned air transformer configured to transfer signals in the test lead to a transformer in the electrical meter. In these examples, the connector may comprise a mechanical coupler to attach the test lead to the electrical meter.

As mentioned briefly above the flexible core of the flexible elongate member may comprise partially magnetic material. For example, the flexible core of the flexible elongate member may comprise a flexible at least partially magnetic element comprising a high-permeability ferromagnetic compound, such as ferric oxide, mixed with a plastic binder. In other examples, the flexible core of the elongate-current sensing coil structure may comprise a flexible elastomer material in which magnetic material, such as magnetic metallic filings, may be disposed.

FIGS. 9-14 show examples of a flexible elongate member 69 comprising a current-sensing coil 70 disposed about an at least partially magnetic core 71. In these examples the flexible core 71 of the flexible elongate member 69 comprises at least one magnetic element 72. The flexible core 71 may also comprise non-magnetic parts. In some examples the at least one magnetic element may be configured to provide one or more region of overlap such that a respective gap 73 is provided in each region of overlap. Each respective gap 73 may be configured such that the effective magnetic permeability of the at least partially magnetic core 71 is maintained during flexing.

Figure 10:
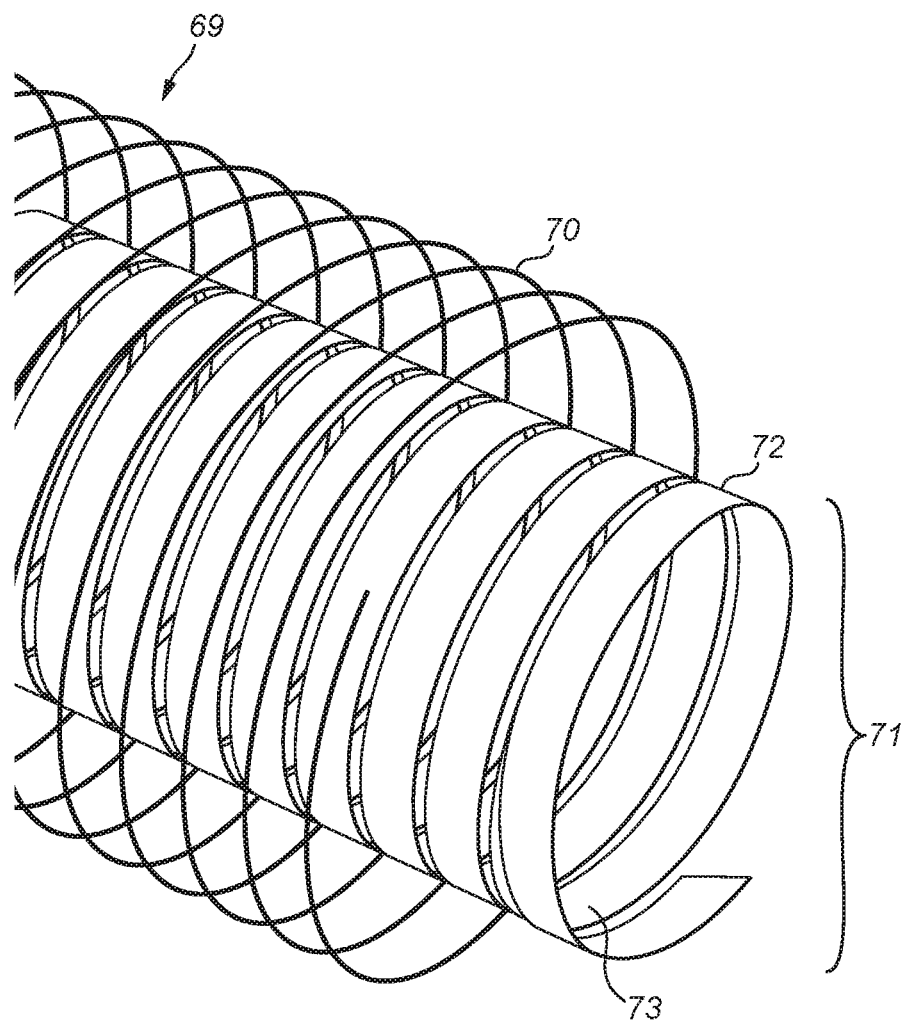
FIG. 10 is a schematic diagram of a perspective view of a flexible elongate member according to examples.

FIG. 10 shows an example where the at least partially magnetic core 71 comprises one magnetic element 72 arrange substantially helically. The substantially helical arrangement of the magnetic element 72 may in some examples have a substantially circular cross-section, but in other examples may have a non-circular cross-section. In some examples, the cross-section may be elongated or flattened.

Figure 11:
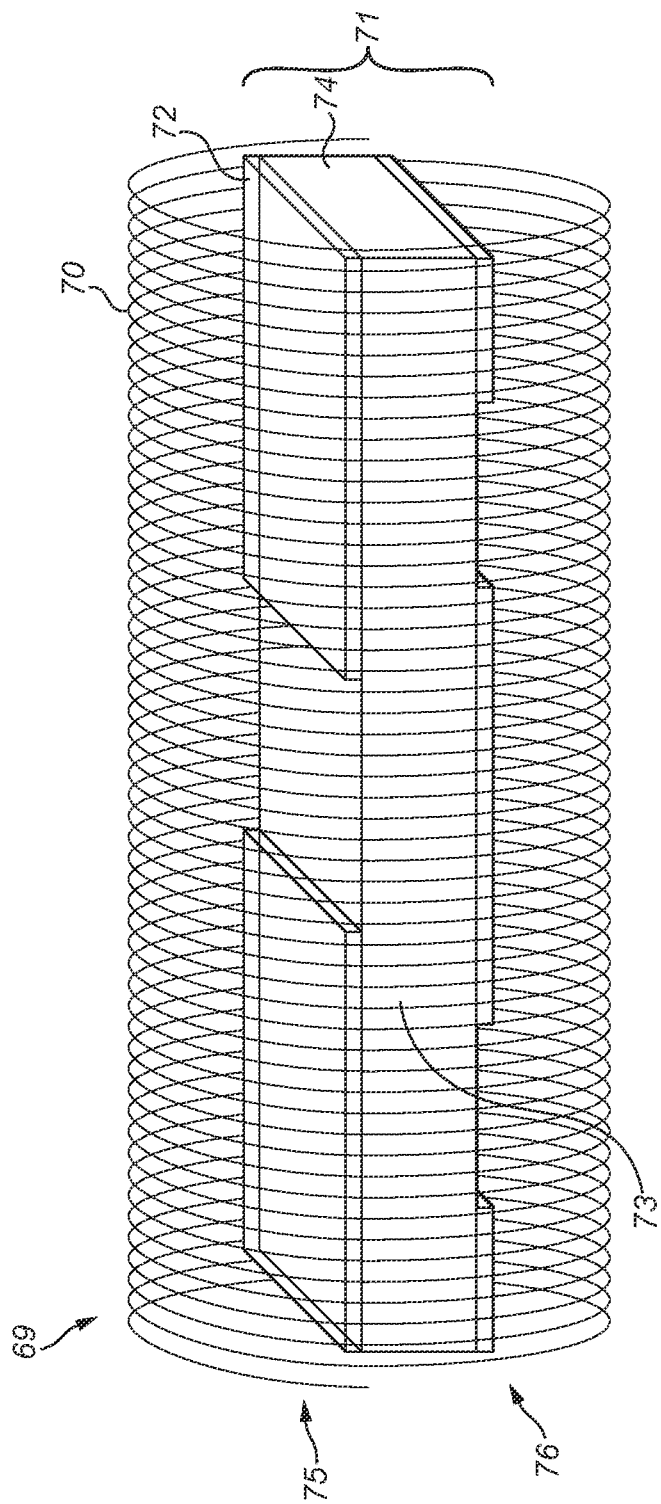
FIG. 11 is a schematic diagram of a perspective view of a flexible elongate member according to examples.

FIG. 11 shows an example in which the at least partially magnetic core 71 comprises a flexible non-magnetic substrate 74 on which at least one magnetic element 72 is disposed. In an example, the flexible non-magnetic substrate 74 may be polycarbonate plastic tape. In some examples, the flexible non-magnetic substrate 74 may be between 0.01 and 1.00 mm in thickness. In other examples, the flexible non-magnetic substrate 74 may be between 1 mm and 10 mm in thickness, and in still other examples, the flexible non-magnetic substrate 74 may be greater than 10 mm in thickness. The at least one magnetic element 72 may be affixed to the flexible non-magnetic substrate 74 by adhesive. For example, the flexible non-magnetic substrate 74 may comprise an adhesive layer. In other examples, the at least one magnetic element 72 may be affixed to the flexible non-magnetic substrate 74 mechanically using, for example, screws, bolts, pins, clips, press studs, and the like. In some examples the at least one magnetic element 72 may be integrally formed with flexible non-magnetic substrate 74. Any other suitable method of affixing the at least one magnetic element 72 to the flexible non-magnetic substrate 74 may be used. In the examples of FIG. 11, the flexible at least partially magnetic core 71 comprises a first layer 75 of magnetic elements disposed on a first side of the flexible non-magnetic substrate 74 and a second layer 76 of magnetic elements disposed on a second and opposite side of the flexible non-magnetic substrate 74. In this example the flexible non-magnetic substrate 74 is disposed in the respective gap 73 in each of the one or more regions of overlap. In some examples the magnetic elements 72 may be embedded either partially or fully within the flexible non-magnetic substrate 74. In some examples, there may be multiple layers of magnetic elements on opposite sides of the flexible non-magnetic substrate 74.

Figure 12A:
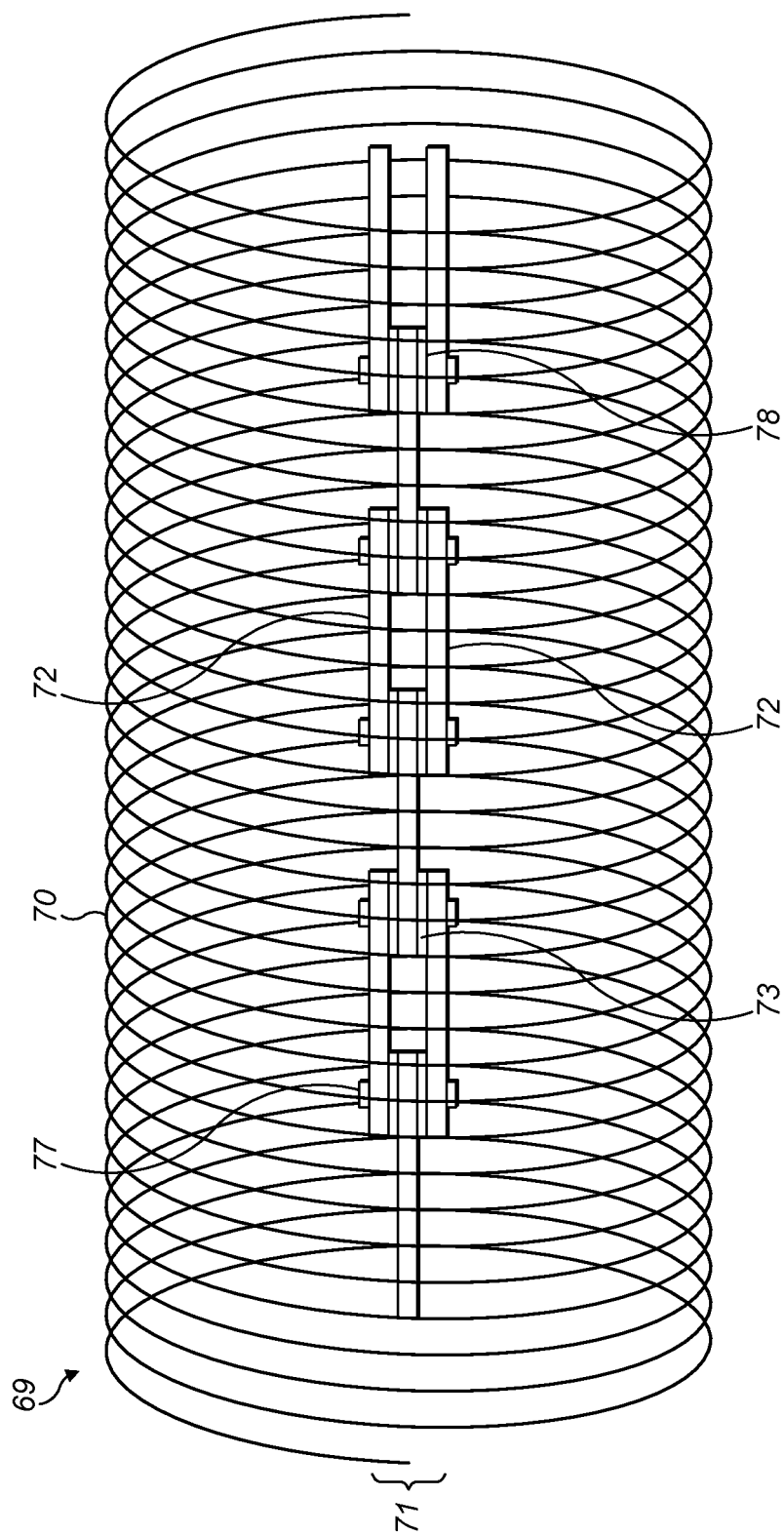
FIG. 12a is a schematic diagram of a side-on view of a flexible elongate member according to examples.
Figure 12B:
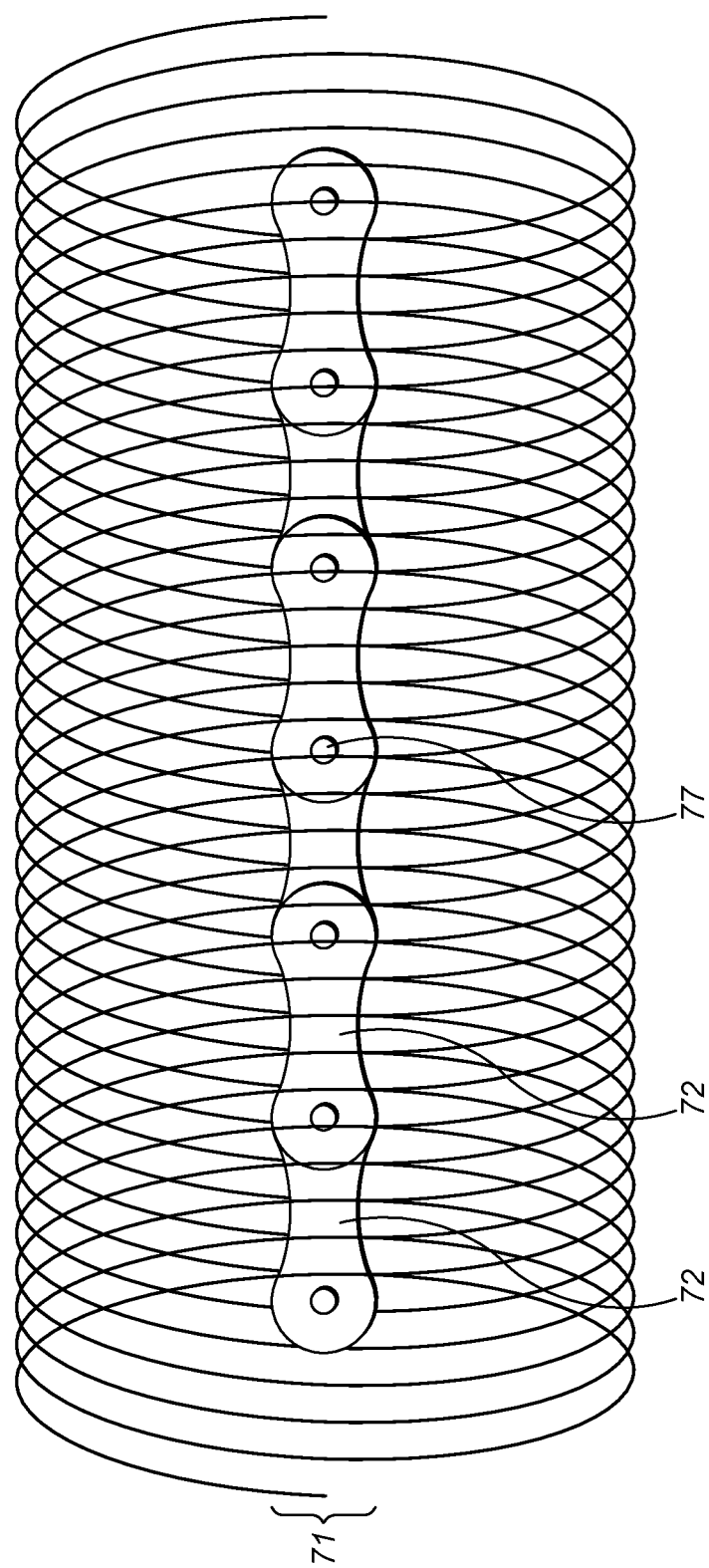

FIGS. 12a and 12b show an example wherein the magnetic elements 72 are arranged in two layers such that each magnetic element 72 in a layer overlaps with a magnetic element 72 in an adjacent layer. Each magnetic element is arranged to pivot about a point 77 in a region of overlap with another magnetic element. FIG. 12a shows a top down or "birds-eye" view of the flexible elongate member 69 while FIG. 12b shows a side-on view. In the example according to FIGS. 12a and 12b there are provided non-magnetic spacers 78 which are disposed in the respective gaps 73 in the one or more regions of overlap between overlapping magnetic elements. Pivoting of the magnetic elements 72 provides the flexibility of the at least partially magnetic core 71.

In some examples, the magnetic elements 72 may be arranged in more than two such layers and in other examples the magnetic elements 72 may be arranged as a single layer, for example, a series of magnetic elements 72 connected to one another by non-magnetic pivots.

Figure 13:
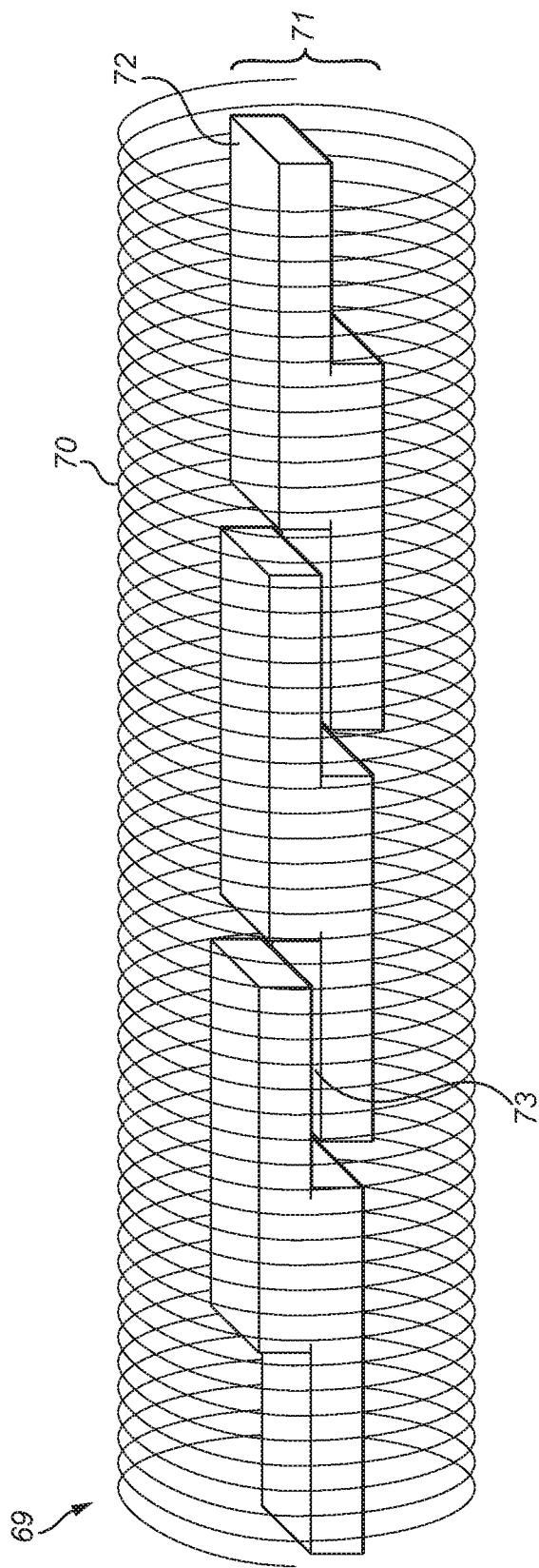
FIG. 13 is a schematic diagram of a perspective view of a flexible elongate member according to examples.

FIG. 13 shows an example of a flexible elongate member 69 comprising a current-sensing coil 70 at least partially disposed about a flexible core 71 along the length of the member, comprising a plurality of magnetic elements 72 arranged in a single layer and shaped such that adjacent magnetic elements in the single layer overlap. In the example of FIG. 13, the layers of overlap are provided by the shape of the magnetic elements 72 which resemble an 'S' or 'Z' shape. The magnetic elements 72 may be configured to pivot with respect to one another at the region of overlap such that the core 71 is flexible.

Figure 14:
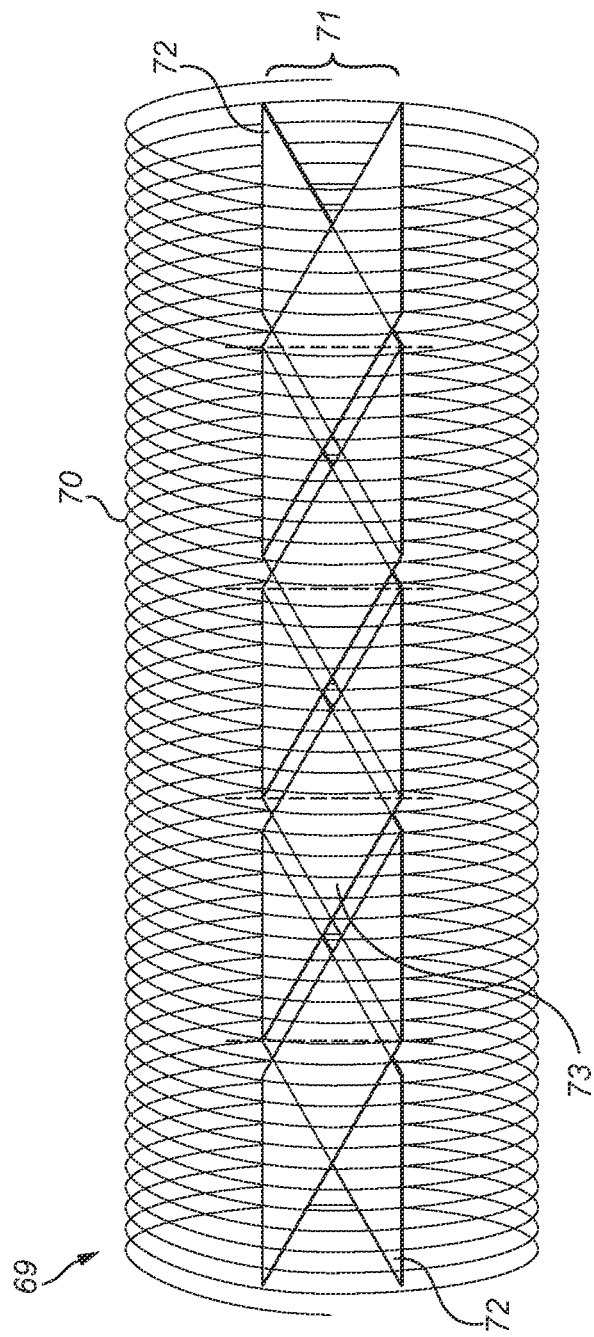
FIG. 14 is a schematic diagram of a top-down view of a flexible elongate member according to examples.

FIG. 14 shows an example of a flexible elongate member 69 comprising a current-sensing coil 70 at least partially disposed about a flexible at least partially magnetic core 71 comprising two magnetic elements 72 arranged as intertwining strips. The intertwined magnetic elements 72 may have regions of overlap where the strips overlap one another. In other examples, the strips arranged in one or more layers may be another shape such as round circles of ovals.

The above embodiments are to be understood as illustrative examples of the invention. Further embodiments of the invention are envisaged. For example, the flexible core of the flexible elongate member may comprise an array of ball and socket type, at least partially magnetic, elements configured to provide flexibility. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A test lead for an electrical meter, the test lead comprising:
 a flexible elongate member comprising a current sensing coil at least partially disposed about a flexible core along the length of the member;
 a first connector disposed at one end of the member for coupling a respective end of the current sensing coil to a test port of an electrical meter; and
 a second connector disposed at an opposing end of the member, the second connector being adapted for coupling a respective end of the current sensing coil to an electrically conductive member for electrical connection to a test point of an electrical circuit, to provide an electrical path, via the current sensing coil, from the electrically conductive member to the first connector.

2. A test lead according to claim 1, wherein the flexible elongate member comprises the current-sensing coil and a return conductor disposed along the length of the flexible elongate member, the current sensing coil and the return conductor being isolated from one another in the test lead.

3. A test lead according to claim 2, wherein the current-sensing coil is a helically coiled conductor wound around the return conductor.

4. A test lead according to claim 2, wherein the return conductor is positioned externally to the current-sensing coil.

5. A test lead according to claim 1, wherein the second connector comprises an insulating part.

6. A test lead according to claim 5, wherein at least part of the current-sensing coil is disposed within the insulating part.

7. A test lead according to claim 1, wherein the second connector comprises a mechanical attachment part for coupling the respective end of the test lead to a second test lead.

8. A test lead according to claim 1, wherein the second connector comprises an electrical and mechanical attachment part for coupling the respective end of the current-sensing coil to the second test lead, to provide an electrical path, via the current sensing coil, from the first connector to a further current sensing coil of the second test lead.

9. A test lead according to claim 7, wherein the second connector comprises a receiving portion for receiving a further electrically conductive member.

10. A test lead according to claim 1, wherein the electrically conductive member is a crocodile clip.

11. A test lead according to claim 1, wherein the electrically conductive member is a banana plug.

12. A test lead according to claim 1, wherein the second connector comprises an electrically conductive tip for electrical connection to a test point.

13. A test lead according to claim 12, wherein the electrically conductive tip comprises a pointed end.

14. A test lead according to claim 2, wherein the second connector is for coupling the respective end of the current-sensing coil to an electrically conductive member, to provide a first electrical path, via the current sensing coil, from the electrically conductive member to the first connector, and for coupling a respective end of the return conductor to a further electrically conductive member, to provide a second electrical path, via the return conductor, from the second electrically conductive member to the first connector.

15. A test lead according to claim 1, wherein the flexible core is at least partially magnetic, the flexible core comprising at least one magnetic element,
   wherein the at least one magnetic element is configured to provide one or more regions of overlap such that a respective gap is provided in each region of overlap, each respective gap being configured such that the effective magnetic permeability of the at least partially magnetic core is maintained during flexing.

16. A test lead according to claim 1, wherein the flexible core is at least partially magnetic, the flexible core comprising at least one flexible at least partially magnetic element.

17. A test lead according to claim 1, wherein the flexible core is at least partially magnetic, the flexible core comprising a plurality of magnetic elements configured to provide respective gaps between each magnetic element.

18. A test lead according to claim 17, wherein each respective gap being configured such that the effective magnetic permeability of the at least partially magnetic core is maintained during flexing.

19. An electrical meter comprising at least a first test lead according to claim 1.

20. An electrical meter according to claim 19, wherein at least one test lead is detachable from the electrical meter.

* * * * *